US012676593B2

(12) United States Patent
Ballandras et al.

(10) Patent No.: US 12,676,593 B2
(45) Date of Patent: Jul. 7, 2026

(54) TRANSDUCER STRUCTURE FOR AN ACOUSTIC WAVE DEVICE

(71) Applicant: Soitec, Bernin (FR)

(72) Inventors: Sylvain Ballandras, Besançon (FR);
Emilie Courjon, Besançon (FR);
Florent Bernard, Besançon (FR)

(73) Assignee: Soitec, Bernin (FR)

( * ) Notice: Subject to any disclaimer, the term of this patent is extended or adjusted under 35 U.S.C. 154(b) by 1068 days.

(21) Appl. No.: 17/753,428

(22) PCT Filed: Sep. 18, 2020

(86) PCT No.: PCT/IB2020/000784
§ 371 (c)(1),
(2) Date: Mar. 2, 2022

(87) PCT Pub. No.: WO2021/053401
PCT Pub. Date: Mar. 25, 2021

(65) Prior Publication Data
US 2022/0337220 A1 Oct. 20, 2022

(30) Foreign Application Priority Data

Sep. 18, 2019 (EP) ..................................... 19306123
Sep. 18, 2019 (EP) ..................................... 19306124

(51) Int. Cl.
*H03H 9/02* (2006.01)
*H03H 3/02* (2006.01)
(Continued)

(52) U.S. Cl.
CPC .............. *H03H 9/145* (2013.01); *H03H 3/02* (2013.01); *H03H 9/02031* (2013.01);
(Continued)

(58) Field of Classification Search
CPC .. H03H 9/145; H03H 9/0207; H03H 9/02102; H03H 9/02149; H03H 9/02228;
(Continued)

(56) References Cited

U.S. PATENT DOCUMENTS

2002/0153969 A1 10/2002 Inoue et al.
2003/0011280 A1 1/2003 Nakahata et al.
(Continued)

FOREIGN PATENT DOCUMENTS

CN 103368522 A 10/2013
CN 106575637 A 4/2017
(Continued)

OTHER PUBLICATIONS

Ballandras et al., Finite-Element Analysis of Periodic Piezoelectric Transducers, Journal of Applied Physics, vol. 93, No. 1, (Jan. 1, 2003), pp. 702-710.
(Continued)

*Primary Examiner* — Derek J Rosenau
(74) *Attorney, Agent, or Firm* — TraskBritt

(57) ABSTRACT

A transducer structure for a surface acoustic device comprises a composite substrate comprising a piezoelectric layer, a pair of inter-digitated comb electrodes, comprising a plurality of electrode means with a pitch p satisfying the Bragg condition, wherein the inter-digitated comb electrodes are embedded in the piezoelectric layer such that, in use, the excitation of a wave propagating mode in the volume of the electrode means is taking place and is the predominant propagating mode of the structure. The present disclosure relates also to an acoustic wave device comprising at least one transducer structure as described above and to a method for fabricating the transducer structure. The present disclosure relates also to the use of the frequency of the bulk wave propagating in the electrode means of the
(Continued)

100 ⟍ transducer structure in an acoustic wave device to generate contribution at high frequency, in particular, above 3 GHz.

38 Claims, 31 Drawing Sheets

(51) Int. Cl.

| | |
|---|---|
| *H03H 9/13* | (2006.01) |
| *H03H 9/145* | (2006.01) |
| *H03H 9/17* | (2006.01) |
| *H03H 9/25* | (2006.01) |

(52) U.S. Cl.

CPC ...... *H03H 9/0207* (2013.01); *H03H 9/02102* (2013.01); *H03H 9/02149* (2013.01); *H03H 9/02228* (2013.01); *H03H 9/02559* (2013.01); *H03H 9/132* (2013.01); *H03H 9/175* (2013.01); *H03H 9/176* (2013.01); *H03H 9/25* (2013.01)

(58) Field of Classification Search

CPC .... H03H 9/02559; H03H 9/132; H03H 9/175; H03H 9/176

USPC ...... 310/313 R, 313 A, 313 B, 313 C, 313 D

See application file for complete search history.

(56) References Cited

U.S. PATENT DOCUMENTS

| | | | |
|---|---|---|---|
| 2007/0090895 A1* | 4/2007 | Nishizawa ......... | H03H 9/02874 333/195 |
| 2011/0037343 A1* | 2/2011 | Isobe ................ | H03H 9/02559 310/313 A |
| 2011/0199168 A1 | 8/2011 | Kadota | |
| 2012/0133246 A1* | 5/2012 | Yaoi ...................... | H03H 9/131 310/313 C |
| 2013/0015744 A1 | 1/2013 | Adkisson et al. | |
| 2013/0285768 A1 | 10/2013 | Watanabe et al. | |
| 2014/0203893 A1 | 7/2014 | Kando et al. | |
| 2017/0063332 A1 | 3/2017 | Gilbert et al. | |
| 2017/0214387 A1 | 7/2017 | Burak et al. | |
| 2017/0236991 A1 | 8/2017 | Nakagawa | |
| 2017/0288629 A1* | 10/2017 | Bhattacharjee .... | H03H 9/02275 |
| 2018/0375491 A1 | 12/2018 | Iwaki et al. | |
| 2019/0097604 A1* | 3/2019 | Saji .......................... | H03H 9/25 |
| 2019/0319603 A1 | 10/2019 | Kadota et al. | |
| 2020/0036357 A1 | 1/2020 | Mimura | |
| 2020/0186119 A1 | 6/2020 | Yamamoto et al. | |
| 2020/0212884 A1 | 7/2020 | Shin et al. | |
| 2020/0280302 A1 | 9/2020 | Miyamoto | |
| 2020/0403604 A1 | 12/2020 | Tani | |
| 2021/0226602 A1 | 7/2021 | Kishida et al. | |
| 2022/0362162 A1 | 11/2022 | Gao et al. | |

FOREIGN PATENT DOCUMENTS

| | | |
|---|---|---|
| DE | 112017005984 | 8/2019 |
| JP | H04-207618 A | 7/1992 |
| JP | 09-083030 A | 3/1997 |
| JP | 9167935 A | 6/1997 |
| JP | 09-214285 A | 8/1997 |
| JP | 11-266138 A | 9/1999 |
| JP | 2000-315931 A | 11/2000 |
| JP | 2002-057549 A | 2/2002 |
| JP | 2002-111442 A | 4/2002 |
| JP | 2002-319842 A | 10/2002 |
| JP | 2002-353769 A | 12/2002 |
| JP | 2003-152487 A | 5/2003 |
| JP | 2003-163575 A | 6/2003 |
| JP | 2007-060412 A | 3/2007 |
| JP | 2008-294538 A | 12/2008 |
| JP | 2010-068503 A | 3/2010 |
| JP | 2012-105252 A | 5/2012 |
| JP | 2013-520830 A | 6/2013 |
| JP | 2014-192676 A | 10/2014 |
| JP | 2017-532758 A | 11/2017 |
| JP | 2017-228945 A | 12/2017 |
| JP | 2018-506930 A | 3/2018 |
| JP | 2018-098671 A | 6/2018 |
| JP | 2019-062350 A | 4/2019 |
| JP | 2019-062441 A | 4/2019 |
| JP | 2019-075704 A | 5/2019 |
| JP | 2019-077607 A | 5/2019 |
| JP | 2019-097145 A | 6/2019 |
| JP | 2019-140456 A | 8/2019 |
| JP | 2019-526194 A | 9/2019 |
| JP | 2022-510170 A | 1/2022 |
| KR | 10-2017-0038819 A | 4/2017 |
| WO | 2010/058570 A1 | 5/2010 |
| WO | 2011/018913 A1 | 2/2011 |
| WO | 2012/036178 A1 | 3/2012 |
| WO | 2012/086441 A1 | 6/2012 |
| WO | 2014/054580 A1 | 4/2014 |
| WO | 2017/043427 A1 | 3/2017 |
| WO | 2018/164211 A1 | 9/2018 |
| WO | 2018/168503 A1 | 9/2018 |
| WO | 2019/131530 A1 | 7/2019 |

OTHER PUBLICATIONS

Hirabayashi et al., Optimization of Surface-Acoustic-Wave Withdrawal-Weighted Filters Using Simulated Annealing, Jpn. J. Appl. Phys. vol. 36, (1997), pp. 5371-5372.

International Search Report for Application No. PCT/IB2020/000784 dated Mar. 16, 2021, 7 pages.

International Written Opinion for Application No. PCT/IB2020/000784 dated Mar. 16, 2021, 14 pages.

Japanese Notice of Reasons for Refusal and Search Report for Japanese Application No. 2024-027731, dated Feb. 7, 2025, 88 pages with English translation.

Daniel et al., "Damascene technique applied to surface acoustic wave devices",, Journal of Vacuum Science and Technology: Part B, AVS / AIP, Melville, New York, NY, US, vol. 25, No. 1, Jan. 30, 2007 (Jan. 30, 2007), pp. 271-276, XP012102822.

European Search Report and Search Opinion Received for EP Application No. 19306123.1, dated on Mar. 20, 2020, 12 pages.

Japanese Decision of Refusal for Japanese Application No. 2022-510846, dated Dec. 5, 2023, 12 pages with English translation.

Japanese Decision to Grant a Patent for Japanese Application No. 2022-510170, dated Aug. 6, 2024, 5 pages with English translation.

Japanese Decision to Grant a Patent for Japanese Application No. 2022-510846, dated May 7, 2024, 5 pages with English translation.

Japanese Notice of Reasons for Refusal for Japanese Application No. 2022-510170, dated Nov. 7, 2023, 14 pages with English translation.

Japanese Notification of Refusal for Application No. 2022-510846 dated Jun. 5, 2023, 8 pages.

Korean Request for the Submission of an Opinion received for Korean Patent Application No. 10-2022-7012796, mailed on Mar. 18, 2024, 13 pages With English Translations.

Korean Request for the Submission of an Opinion received for Korean Patent Application No. 10-2022-7012799, mailed on Mar. 18, 2024, 13 pages With English Translations.

Japanese Notice of Reasons for Refusal for Application No. 2022-510170 dated Mar. 25, 2024, 8 pages.

Japanese Notice of Reasons for Rejection for Application No. 2022-510170 dated Jun. 13, 2023, 7 pages.

Korean Request for the Submission of an Opinion for Application No. 10-2022-7012796 dated Apr. 15, 2024, 7 pages.

European Communication pursuant to Article 94(3) EPC for European Application No. 20793434.0, dated Jul. 22, 2025, 10 pages.

European Communication pursuant to Article 94(3) EPC for European Application No. 20796643.3, dated Jul. 23, 2025, 13 pages.

English Translation of CN Office Action received for Chinese Patent Application No. 202080062057, mailed on Dec. 2, 2025, 5 pages.

(56) References Cited

OTHER PUBLICATIONS

English Translation of CN Office Action received for Chinese Patent Application No. 202080062067, mailed on Dec. 10, 2025, 15 pages.

* cited by examiner

TRANSDUCER STRUCTURE FOR AN ACOUSTIC WAVE DEVICE

CROSS-REFERENCE TO RELATED APPLICATIONS

This application is a national phase entry under 35 U.S.C. § 371 of International Patent Application PCT/IB2020/000784, filed Sep. 18, 2020, designating the United States of America and published as International Patent Publication WO 2021/053401 on Mar. 25, 2021, which claims the benefit under Article 8 of the Patent Cooperation Treaty to European Patent Application Serial No. 19306123.1, filed Sep. 18, 2019 and of the Patent Cooperation Treaty to European Patent Application Serial No. 19306124.9, filed Sep. 18, 2019.

TECHNICAL FIELD

The present disclosure relates to acoustic wave devices, in particular, to transducer structures for an acoustic wave device.

BACKGROUND

In recent years, surface acoustic wave (SAW) devices have been employed in an increasing number of practical applications, such as filters, sensors and delay lines. In particular, SAW filters are interesting for mobile phone applications due to their ability to form low loss high order bandpass filters without employing complex electrical circuits with unprecedented compactness. Therefore, SAW filters provide significant advantages in performance and size over other filter technologies.

In a typical surface acoustic wave device, one or more inter-digitated transducers (IDTs) are formed over a surface propagating substrate and are used to convert acoustic waves to electrical signals and vice versa by exploiting the piezoelectric effect of the substrate. An inter-digitated transducer (IDT) comprises opposing "electrode combs" with inter-digitated metal fingers disposed on a piezoelectric substrate. A Rayleigh surface acoustic wave develops on the substrate by electrically exciting the fingers. The other wave types, shear and longitudinally polarized wave, travel in the volume and get absorbed, thus requiring optimized metal grating thicknesses to be used for filter applications. Conversely, an electrical signal can be induced across the fingers by a surface acoustic wave propagating in the piezoelectric substrate material beneath the transducer.

SAW devices commonly use wafers made from a monolithic Quartz, $LiNbO_3$ or $LiTaO_3$ crystals as piezoelectric materials. However, the use of piezoelectric substrates leads to either high sensibility to temperature in the case of $LiNbO_3$ or $LiTaO_3$ or weak electromechanical coupling in the case of Quartz depending on the piezoelectric material used.

Furthermore, elastic wave velocities are generally limited by the single crystal material properties, particularly considering phase velocity, which remains between 3000 and 4000 m/s most of the time. Indeed, in the case of Quartz, Rayleigh surface acoustic waves are the most used modes and their phase velocity ranges from 3000 to 3500 m·s-1. The use of shear waves allows for phase velocity up to 5100 m·s-1. In Quartz, coupling is limited to 0.5%. In the case of Lithium Tantalate, Rayleigh waves exhibit phase velocity in the range 3000-3500 m·s-1 but the mode coupling may hardly reach 2%. Rayleigh waves on Lithium Niobate reach phase velocities up to 3900 m·s-1 with a coupling factor of 5.6%, potentially achieving 8% with using a $SiO_2$ passivation layer above the IDTs.

Shear waves also called pseudo modes, on $LiTaO_3$ and $LiNbO_3$ are exhibiting radiation leakage, so called leaky modes. In that case, the surface is partially guiding the waves. Therefore, the electrode grating plays a major role in trapping the energy close to the surface. The phase velocity is in the range of 4000-4500 m·s-1 for both materials.

Finally, compressional modes can also be excited on $LiTaO_3$ and $LiNbO_3$ substrates along certain crystal cuts but also here, the modes are leaky by nature, thus requiring specific electrode thicknesses vs frequency to minimize leakage effects due to wave radiation into the bulk.

BRIEF SUMMARY

One approach to overcome the leakage effects has led to the use of composite substrates. A composite substrate comprises a piezoelectric layer formed over a base substrate. A composite substrate gives a large choice of materials for the base substrate and base substrate materials with a high acoustic wave propagation velocity can be chosen, such as Diamond, Sapphire, silicon carbide or Silicon. Similar to optics, the use of such a base substrate leads to the guidance of the mode.

Composite substrates can combine strong electro mechanical coupling, i.e., an electromechanical coefficient $k_s^2$ larger than 1%, and temperature stability, i.e., a temperature coefficient of frequency (TCF) smaller than 20 ppm/K, and can improve the performance of the SAW devices and provide flexibility of design.

However, acoustic wave devices are limited to operating frequencies from about 1 to 3 GHz, as for the given phase velocities, the electrode pitch or mechanical period p of the comb electrodes determines the wavelength $\lambda$ of the acoustic wave given by the relation $p=\lambda/n$, with $n \geq 2$, generally equal to 2. Operation at frequency above 2 GHz requires metal dimension and thickness of the order or below 100 nm, which present stability problems of the structure. Thus, in practice, it is difficult to further miniaturize comb electrodes when higher operating frequencies are required. This is on the one hand due to the need to use higher resolution lithography technology compared to the I-line lithography used today in SAW industry, and on the other hand due to electric losses occurring in the structure.

Therefore, to create SAW devices above 3 GHz, a strong technological effort is required.

The object of the present disclosure is thus to overcome the drawbacks cited previously by providing an inter-digitated transducer structure for an acoustic wave device with improved parameters and to provide an acoustic wave device that can function for frequencies exceeding 3 GHz but that can still be manufactured using standard I-line lithography.

The object of the present disclosure is achieved by a transducer structure for an acoustic wave device comprising: a piezoelectric layer, a pair of inter-digitated comb electrodes, comprising a plurality of electrode means with a pitch p wherein the electrode means of the inter-digitated comb electrodes are embedded in the piezoelectric layer and the acoustic impedance of the electrode means is less than the acoustic impedance of the piezoelectric layer. According to a variant, the entire inter-digitated comb electrodes can be embedded.

In the inventive device, because the electrode means are embedded in the piezoelectric layer and with the acoustic impedance of the electrode means being smaller than the one of the piezoelectric layer a shear wave like propagating mode (electrode mode) essentially limited to the volume of the electrode means, can be excited. Actually, the boundary conditions are such that it becomes possible to excite that shear mode within the electrode means. Due to the acoustic impedance contrast, the reflection at the lateral edges of the electrode means is large enough to essentially confine the energy within the electrode. Due to the grating configuration by the inter-digitated comb electrodes and in the presence of an alternating electrical polarity, some vibration is nevertheless induced within the piezoelectric layer that leads to a coherence between the vibration of the electrodes, which leads to the resonance phenomenon with phase vibration from one electrode the next neighboring electrode being opposite. The operating acoustic wavelength $\lambda$ of the transducer is linked to the resonant frequency $f_r$ of the transducer structure as $f_r = v/2p = v/\lambda$, v being the acoustic wave propagation velocity in the acoustic wave propagating substrate. Thus, in the given geometry much higher equivalent phase velocities, e.g., even of the order of 10,000 m·s$^{-1}$ can be observed than mentioned above. Since the bulk acoustic wave inside the electrode means has a resonance at higher frequency compared to the guided wave in the piezoelectric layer in prior art constellations as described above, this mode allows the transducer structure to function at higher frequencies above 3 GHz, without being at the limit of the fabrication technology of I-line lithography compared to state of the art transducer structure.

In particular, the ratio between acoustic impedance of the electrode means to the piezoelectric layer is preferably less than 0.5 Material combinations yielding an electro mechanical coupling of more than 2%, preferably more than 3%, favor the establishment of the mode inside the electrodes and a coherent coupling between the electrodes.

According to a variant, the pitch p satisfies the Bragg condition given by p=$\lambda$/2, $\lambda$ being the operating acoustic wavelength of the transducer. In this condition, the electrode mode is more efficiently excited.

According to a variant of the present disclosure, the metallization ratio a/p of the electrode means, with "a" the width and "p" the pitch of the electrode means, can be between 0.3 and 0.75, in particular, between 0.4 and 0.65. Using an a/p ratio in this range favors the formation of the excited bulk acoustic wave in the electrode means, and reduces or suppresses the contribution of the acoustic surface mode of the piezoelectric layer.

According to a variant of the present disclosure, the piezoelectric layer can be provided over a base substrate. Using a base substrate favors the confinement of energy near the surface and, in particular, inside the electrode means.

According to a variant, the transducer structure can further comprise an attachment layer, in particular, silicon dioxide (SiO$_2$) between the piezoelectric layer and the base substrate. Via an attachment layer, various materials can be used as piezoelectric layer and underlying base substrate to optimize the transducer structure. Silicon dioxide can be used to improve the temperature coefficient of frequency (TCF).

According to a variant, the transducer structure can further comprise a high velocity layer between the piezoelectric layer and the base substrate, wherein the high velocity layer is made of a material allowing a higher phase velocity of a shear wave than the material and crystal orientation of the piezoelectric layer. This will allow for accelerating the fundamental shear mode, the phase velocity of which can be larger than the slow shear bulk wave velocity also called surface skimming bulk wave (SSBW) of the base substrate, in which case the fundamental shear mode cannot be guided in the piezoelectric layer but will dissipate in the base substrate.

According to a variant, the high velocity layer can be positioned between the attachment layer and the base substrate. By positioning the attachment layer between the piezoelectric layer and the high velocity layer, one can take advantage of the acceleration properties and at the same time the attachment process of the piezoelectric layer to the underlying structure does not have to be changed so that high quality piezoelectric layers can be obtained independently of the material choice of the high velocity layer.

According to a variant, the transducer structure can further comprise a trap rich layer, in particular, a polysilicon trap rich layer, between the piezoelectric layer and the base substrate. With the trap rich layer leak currents can be suppressed.

According to a variant, the trap-rich layer can be positioned between the high velocity layer and the base substrate. In this order, the individual advantages of the various layers can be kept in the overall structure.

According to a variant, the transducer structure can further comprise a covering layer on top of the embedded electrode means and the piezoelectric layer. This further improves guiding of the shear mode in the electrodes and further reduces the possibility of electro migration.

According to a variant, the covering layer can be made of a material and/or having a crystal orientation allowing a higher phase velocity of a shear wave than the material and/or crystal orientation of the piezoelectric layer. The material of the covering layer can thus be chosen such that the velocity of the fundamental shear mode becomes accelerated compared to its velocity in the piezoelectric layer. This promotes dissipation into the volume of the base substrate so that essentially only the electrode mode remains in the guiding domain of the piezoelectric layer.

According to a variant of the present disclosure, the transducer structure can further comprise a Bragg mirror underneath the piezoelectric layer and/or underneath the embedded electrode means. A Bragg mirror reduces energy loss toward the base substrate, and can add mechanical stability to the device structure.

According to a variant of the present disclosure, the thickness of the embedded electrode means can be less than or equal to the thickness of the piezoelectric layer. Thus, thicker electrodes compared to state of the art transducer structure are used and thereby, besides allowing the establishment of the shear mode in the electrodes, the stability of the electrodes can be increased and Ohmic losses reduced.

According to a variant of the present disclosure, the thickness $t_e$ of the electrode mean $\lambda > t_e > 0.1 * \lambda$. In this thickness range, it becomes possible to concentrate the electromechanical field near the surface, in a region of thickness comparable to that of the electrode for single crystal or of that of the piezoelectric layer plus electrode for composite wafers. This will result in an improved electromechanical coupling and spectral purity allowing for single or at least limited number of, mode contribution to the device response.

According to a variant of the present disclosure, the acoustic impedance of the base substrate of the composite substrate is of the order of the acoustic impedance of the piezoelectric layer, in particular, within a range of plus or minus 25% of the acoustic impedance of the piezoelectric layer, more in particular, within a range of plus or minus 15% of the piezoelectric layer. In particular, in case the electrodes have the same thickness as the piezoelectric layer, the impedance matching allows the confinement of the shear mode in the electrodes.

According to a variant, the embedded electrodes can be filled into grooves in the piezoelectric layer. The grooves can have a cross-section with a pyramidal shape or a trapezoidal shape or a V-shape or a U-shape and/or wherein the side-walls and/or bottom of the grooves have a convex or concave or scalloped shape. In particular, the pyramidal or trapezoidal shapes with the shorter of the parallel sides at the surface of the transducer structure, lead to improved quality factors compared to grooves with vertical walls.

According to a variant of the present disclosure, a dielectric layer can be provided on the bottom of the grooves. According to a variant of the present disclosure, the side-walls and bottom walls of the grooves can be covered with a conductive material and the remainder of the grooves can be filled with a dielectric material. According to a variant of the present disclosure, the grooves can extend through the piezoelectric layer and the sidewalls of the grooves can be covered by a conductive material and the remainder of the grooves can be filled with a dielectric material. According to a variant of the present disclosure, only the sidewalls toward the piezoelectric layer can be covered by the conductive material. According to a variant of the present disclosure, the dielectric material can be a material with a higher shear wave phase velocity than the conductive material. As already explained this will allow accelerating the phase velocity of the fundamental shear wave so that it can be above the SSBW velocity and therefore allow for its dissipation in the base substrate.

According to a variant of the present disclosure, the dielectric material can have a temperature coefficient frequency with a sign opposite to the temperature coefficient frequency of the conductive material. Thus, the device can be used over a wider temperature range.

According to a variant of the present disclosure, the dielectric material of the covering layer and the dielectric material filled in the grooves can be the same. Thus, in one process step both advantageous features can be realized.

According to a variant, the material of the electrode means can be made of a material that is lighter than Manganese, in particular, aluminum or an aluminum alloy comprising Cu, Si or Ti. In particular, the combination of aluminum with lithium tantalate yields at coupling factors of more than 3% while the fundamental shear mode in the piezoelectric layer is absent.

According to a variant, the piezoelectric layer can be lithium tantalate ($LiTaO_3$) or lithium niobate ($LiNbO_3$). For both materials, composite substrates, in particular, so called Piezo on Insulator substrates (POI), can be obtained in an industrial scale.

According to a variant, the base substrate can be silica, silicon dioxide or glass, quartz or fused quartz or glass or $LiTaO_3$ or $LiNbO_3$ or silicon, in particular, Si(111). Using these substrates, the shear mode inside the electrode means remains, whereas the fundamental shear mode in the piezoelectric layer can be suppressed. In Si(111), the SSBW velocity is particularly low compared to Si(100). At the same time, a piezoelectric layer on glass or $SiO_2$ substrates can be obtained in an industrial scale, e.g., by using the piezoelectric-on-insulator (POI) substrates.

According to a variant, the high velocity layer is one of AlN, $Al_2O_3$, $Si_3N_4$, SiC or carbon based, in particular, single crystal diamond, amorphous carbide, nano-gran polycrystal diamond. According to a variant, the covering layer can be one of AlN, $Al_2O_3$, $Si_3N_4$, SiC or carbon based, in particular, single crystal diamond, amorphous carbide, nano-grain polycrystal diamond. According to a variant, the dielectric material can be carbon based, in particular, single crystal diamond, amorphous carbide, nano-grain polycrystal diamond, or AlN or $SiO_2$. These materials allow reducing the fundamental shear mode contributions. The use of $SiO_2$ can improve the TCF properties.

According to a variant, the pair of inter-digitated comb electrodes can comprise one region or more regions in which two or more neighboring electrode means belong to the same comb electrode while having the same distance to each other as the neighboring electrode means belonging to different comb electrodes. Here, the distance is an edge to edge distance that corresponds to the pitch p defined above. According to a variant, the two or more neighboring electrode means belonging to the same comb electrode have the same geometry as the neighboring electrode means belonging to different comb electrodes. By having neighboring electrode means linked to the same potential, but still having the same mechanical periodicity, acoustic sources are removed from the system so that the electro mechanical coupling is reduced. This can be used to tailor the electro mechanical coupling and thereby, when forming filters, adjusting the transfer function of a filter, namely by fine-tuning the width of the band pass.

According to a variant, regions with two or more, in particular, at least three neighboring electrode means, can belong to the same comb electrode are not periodically distributed, in particular, are randomly distributed. They are characterized, in particular, in that neighboring regions have differing distances with respect to each other over the extend of the transducer structure. By reducing the symmetry of the system, spurious contributions of higher order periodicities can be reduced or even suppressed.

According to a variant, regions with two or more neighboring electrode means belonging to the same comb electrode can have different numbers of neighboring electrode means belonging to the same comb electrode. By having regions with different numbers of neighboring electrode means connected to the same potential spurious contributions can be further reduced.

According to a variant, the electrode means of the transducer structure can have dimensions that are realizable by I-line lithography, in particular, having a width larger than 350 nm. Thus, cheaper lithography means compared to lithography tools using a 248 nm or 193 nm or even shorter wavelength can be used to fabricate devices that can be used with frequencies above 3 GHz.

The object of the present disclosure is also achieved with an acoustic wave device comprising at least one transducer structure as described previously, in particular, an acoustic wave resonator, and/or an acoustic wave filter and/or an acoustic wave sensor. The acoustic wave device, which can be operated at frequencies of more than 3 GHz, can be manufactured using I-line lithography technology without using further advanced and therefore more expensive lithography tools. Thus, compared to a Rayleigh surface wave using SAW device, which has its frequency limited to at most 2 GHz, using the electrode shear wave mode allows extending the frequency range without having to change the patterning technology. When using composite substrates a reduced first order temperature coefficient of frequency (TCF) smaller than 20 ppm/K can be achieved, resulting in device performances being stable with temperature. Using the present disclosure, acoustic wave bandpass filter with relative bandwidths larger than 5% or even 10% and up to 15% can be achieved.

According to a variant, the acoustic device can comprise a radio frequency (RF) supply means configured to drive the transducer structure with an RF signal above 3 GHZ. Thus, using I-line lithography devices working above 3 GHz can be realized.

According to a variant, the acoustic wave device can comprises input and output transducer structures as described previously.

The object of the present disclosure is also achieved with a method of using a transducer structure as described above, comprising a step of applying an alternating potential to the two inter-digitated electrodes to excite a shear mode predominantly or exclusively occurring within the electrode means compared to the piezoelectric layer and having an equivalent velocity higher than the fundamental shear wave mode of the piezoelectric layer. At least, the vibration amplitude in the electrode means is larger than in the piezoelectric layer. The use of the higher frequency of the shear wave propagating in the electrode means of the transducer structure as described previously, in particular, for a ladder filter and/or impedance filter and/or coupling filter, leads to devices that function above 3 GHz, more in particular, above 3.5 GHz. At the same time, I-line lithography can be used to form the device.

The object of the present disclosure is also achieved with a method of using a transducer structure like described above, comprising a step of applying an alternating potential to the two inter-digitated electrodes to excite a shear mode in the electrode means with a pair number of neutral lines without exhibiting shear movement inside the electrode and having an equivalent velocity higher than the fundamental shear wave mode of the piezoelectric layer. Exploiting this mode allows to take advantage of the higher resonance frequency so that devices like a ladder filter and/or impedance filter and/or coupling filter can be realized that function above 3 GHz, in particular, above 3.5 GHz, while at the same time I-line lithography is used to form the pattern of the device.

BRIEF DESCRIPTION OF THE DRAWINGS

The present disclosure may be understood by reference to the following description taken in conjunction with the accompanying figures, in which reference numerals identify features of the present disclosure.

DETAILED DESCRIPTION

The present disclosure will now be described in more detail using advantageous embodiments in an exemplary manner and with reference to the drawings. The described embodiments are merely possible configurations according to the present disclosure and it should be borne in mind that the individual characteristics as described above can be provided independently of one another or in combination to achieve further embodiments according to the present disclosure.

Figure 1:
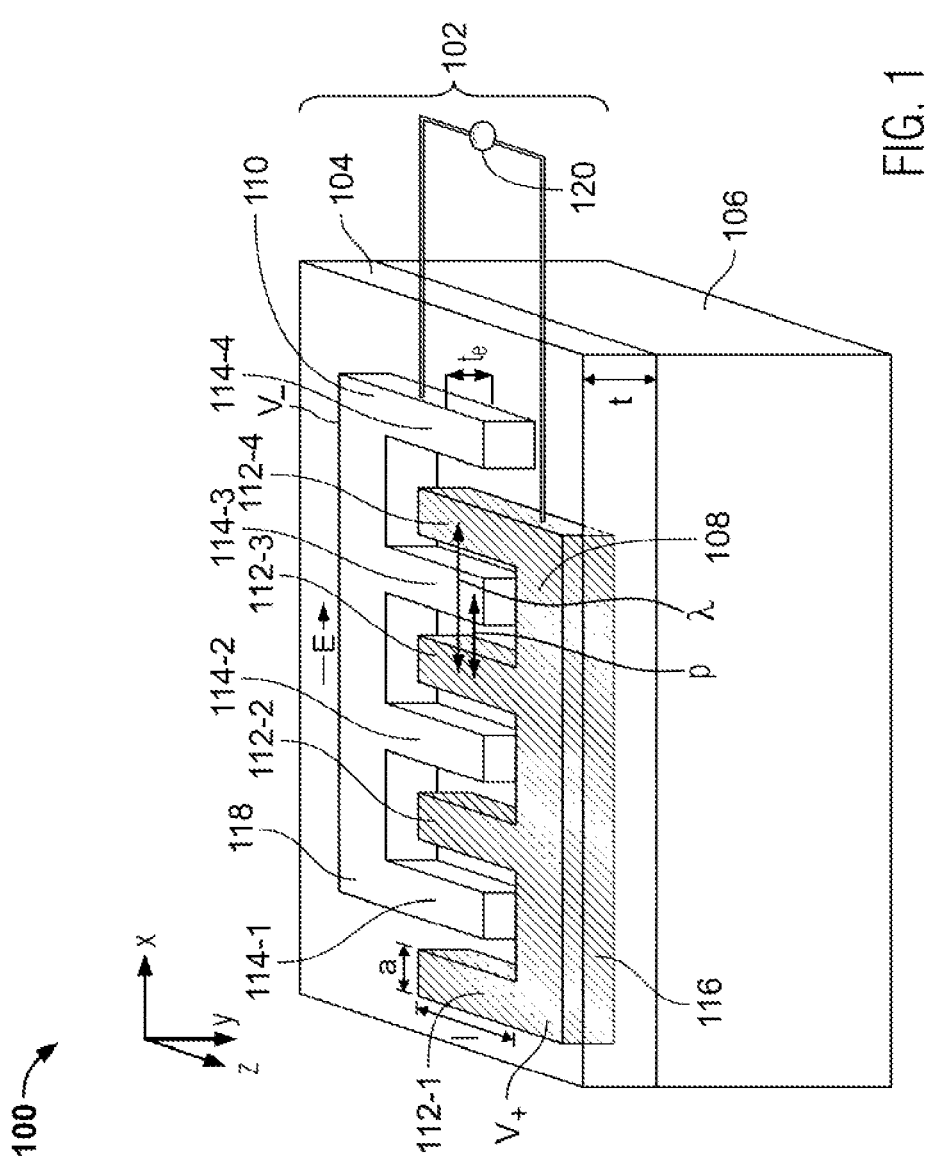
FIG. 1 illustrates an inter-digitated transducer structure on a composite substrate for acoustic wave devices according to a first embodiment of the present disclosure.

FIG. 1 illustrates an inter-digitated transducer structure for acoustic wave devices according to a first embodiment of the present disclosure.

The transducer structure 100 comprises an acoustic wave propagating substrate 102. The acoustic wave propagating substrate can be a composite substrate 102, comprising a piezoelectric layer 104 formed on top of a base substrate 106. The composite substrate can be a so-called piezoelectric-on-insulator substrate or POI substrate. In other embodiments, the piezoelectric layer can be so thick to form a bulk material.

The piezoelectric layer 104 herein described by way of example may be Lithium Niobate (LiNbO$_3$) or Lithium Tantalate (LiTaO$_3$). The piezoelectric layer 104 can be attached to the base substrate 106 by direct bonding e.g., using a Smart Cut™ layer transfer technology. The thickness of the piezoelectric layer 104 formed on the base substrate 106 is of the order of one wavelength $\lambda$ or smaller, in particular, is of about 2 $\mu$m or less, in particular, less than $0.5\lambda$, even more in particular, less than $0.4\lambda$.

The piezoelectric layer herein described by way of example may be Lithium Niobate (LiNbO$_3$), in particular, LiNbO$_3$ with a crystal orientations defined according to standard IEEE 1949 Std-176 as (YXl)/$\theta$ with 36°<$\theta$<52° or 60°<$\theta$<68° or 120°<$\theta$<140° and as (YXt)/$\Psi$ with 85°<$\Psi$<95° and as (YXwlt)/$\Phi$ $\theta\Psi$ with $\Phi$=90°, −30°<$\theta$<+ 45° and 0°<$\Psi$<45° or Lithium Tantalate (LiTaO$_3$), in particular, LiTaO$_3$ with a crystal orientation defined according to standard IEEE 1949 Std-176 as (YXl)/$\theta$ with 36°<$\theta$<52°, more in particular, LiTaO$_3$ with a 42° Y-cut, X-propagation, defined as (YXl)/42° cut according to standard IEEE 1949 Std-176.

As already mentioned, according to a variant, the thickness of the piezoelectric layer 104 can be superior to the wavelength $\lambda$, so that a piezoelectric layer thickness equivalent to a bulk piezoelectric material can also be used.

The base substrate 106 used in the first embodiment of the present disclosure is a silica substrate, silica, quartz, fused quartz or glass. For this kind of substrate the slow shear bulk wave velocity (SSBW) is inferior to the one of the fundamental acoustic bulk shear mode in the piezoelectric layer so that the bulk shear mode of the piezoelectric layer is suppressed by radiation from the surface to the bulk and diffusion.

Other substrates with a high acoustic wave propagation velocity equal or larger than 4500 m/s, like silicon, diamond, sapphire, silicon carbide, silicon nitride or aluminum nitride may be used but in that case the fundamental guided shear mode, corresponding to the one excited when electrodes are positioned on top of the piezoelectric layer, can exist.

In this embodiment, the thickness of the base substrate 106 is larger than the thickness of the piezoelectric layer 104. A preferred situation corresponds to a base substrate thickness that is at least ten times larger than the thickness of the piezoelectric layer 104, in particular, 50 to 100 times larger.

Furthermore, the acoustic impedance of the base substrate 106 of the composite substrate 102 is of the order of the acoustic impedance of the piezoelectric layer, in particular, is within a range of plus/minus 25%, more in particular, within a range of plus/minus 15%. According to a variant, they are the same.

In a variant of the present disclosure, the base substrate 106 may further comprise a trap-rich layer close to the top layer of piezoelectric material. Such a trap-rich layer can improve the isolation performance of the base substrate 106 and may be formed by at least one of polycrystalline, amorphous, or porous materials such as, for instance, polycrystalline Silicon, amorphous Silicon, or porous Silicon. Under the term "trap-rich" one understands a layer that can absorb electrical charges without, however, forming a conductive layer.

The composite substrate can be obtained by a layer transfer method whereby a piezoelectric layer is transferred to a base substrate. Methods like bonding and thinning or a layer transfer method like Smart-Cut™ allowing subwavelength layer transfer can be used. Such composite substrate may comprise an additional layer or layer stacks as, for instance, bonding or attachment layers, in particular, SiO$_2$, or other functional layers, e.g., trap-rich, Bragg mirror, low velocity/high velocity stack.

In a variant, the base substrate 106 may be a semiconductor on insulator (SOI) substrate. A Silicon on Insulator substrate (SOI) is obtained by molecular adhesion, for instance, using an intermediate SiO$_2$ (bonding) layer and a mean to transfer a Silicon layer such as the Smart-Cut™ process.

The transducer structure 100 further comprises a pair of opposing inter-digitated comb electrodes 108 and 110, each of which has a plurality of electrode means, 112_$i$ and 114_$j$ (here 1<=I,j<=4) respectively, extending from their respective conducting portion 116 and 118 and being inter-digitated with each other. The comb electrodes 108 and 110 and, in particular, the electrode means 112_$i$, 114_$j$ are formed of any suitable conductive metal as long as the acoustic impedance is lower than in the piezoelectric layer 104, for example, pure aluminum or alloy such Al doped with Cu, Si or Ti. In general, electrode materials that are lighter than Manganese, thus starting from Chromium or lighter are suited. According to this embodiment, the aspect ratio a/p, with a the width and p the pitch of the electrode means 112_$i$, 114_$j$ is between 0.3 and 0.75, in particular, between 0.4 and 0.65. The metallization or aspect ratio a/p and the thickness t$_e$ of the electrode means 112_$i$, 114_$j$ are the parameter to control radiation losses and electromechanical coupling in the device.

An electrical load 120 is illustrated as being coupled across the comb electrodes 108, 110. However, it will be understood that a source potential 120 may also be coupled across the electrodes 108, 110, depending upon whether the transducer structure 100 is utilized to excite acoustic waves in the substrate 102 or to convert received acoustic waves to electrical signals, or both.

The electrode means, for example, 112_1 to 112_4 and 114_1-114_4 are inter-digitated and are connected to alternating potentials via their respective comb electrodes 108 and 110. The alternating potential can be +V and −V as illustrated or a mass and a load/source potential.

In this embodiment, the electrode means 112_i, 114_j all have the same length 1, width a, and thickness $t_e$. According to a variant of the present disclosure, the electrode means 112_i, 114_j can also have different length 1 and/or width a and/or thickness $t_e$.

The electrode means 112_i and 114_j and their respective comb electrode 108 and 110 are provided in the same plane. According to a variant, the electrode means 112_i and 114_j are embedded into the piezoelectric layer 104 and the comb electrodes 108, 110 providing the electrical connection between the electrode means could be placed above the piezoelectric layer 104.

Furthermore, an electrode pitch p, defined as $\lambda/2$, $\lambda$ being the operating wavelength of the acoustic wave, is used for the transducer structure 100, corresponding to the Bragg condition. The electrode pitch p corresponds to the distance between two neighboring electrode means from opposite comb electrodes 108 and 110, e.g., between 112_3 and 114_3. In this case, the wavelength $\lambda$ corresponds to the distance between two neighboring electrode means from the same comb electrodes 108 or 110, e.g., between 112_3 and 112_4. In such Bragg condition, the transducer is said to be working in a synchronous mode at the operating frequency $f_r$, where all the excited acoustic waves in the transducer structure are coherent and in phase. Thus, the electrode pitch p defines the frequency of utilization of the transducer structure. The operating frequency $f_r$ is fixed by the condition of phase agreement given by v/2p, v being the effective phase velocity of the acoustic wave propagating in the transducer structure 100 and p the electrode pitch of the transducer structure 100.

The electrode means 112_i, 114_j are embedded in the piezoelectric layer 104, preferably fully embedded in the piezoelectric layer 104, so that their thickness $t_e$ is equal to or less than thickness t of the piezoelectric layer 104.

The thickness of the electrode means 112_i to 114_j should satisfy the following relationship with respect to the wavelength $\lambda$: $0.1 < t_e/\lambda < 1$.

Therefore, the electrode means 112_i to 114_j are thicker than the electrodes of state of the art inter-digitated transducer structures with the inter-digitated electrodes formed over the piezoelectric substrate. They therefore offer a better stability and reduced electric losses. Furthermore, power handling is improved as embedded electrodes limit the possibility of acousto-migration and electro-migration due to power effects. The metal is located in a groove, which prevents direct metal contact due to surface diffusion and metal migration.

The conducting portions 116, 118 of the comb electrodes 108, 110 can be provided on the piezoelectric layer 104 and/or the embedded electrode means 112_i, 114_j.

The charge distribution in the electrodes 108 and 110 of the transducer structure 100 excites an acoustic wave in the electrical field direction, meaning perpendicularly to the extension direction z of the electrode means 112_i, 114_j of the electrodes 108, 110, as shown by the arrow E in FIG. 1.

In SAW devices of the art different modes can exist, e.g., Rayleigh surface acoustic waves, Lamb waves or shear waves. In contrast thereto, the inventive transducer structure

100 enables a new mode that leads to a shear like mode that is mainly concentrated inside the electrodes, which will be called electrode mode in the following.

This is because the electrode means are embedded in the piezoelectric layer and in that the acoustic impedance of the electrode means being smaller than the one of the piezoelectric layer. Actually, the boundary conditions are such that it becomes possible to excite that shear mode within the electrode means. The maximum of the vibration occurs in the center of the electrodes and are changing signs from one electrode means to the next neighboring electrode means.

Due to the acoustic impedance contrast, the reflection at the lateral edges of the electrode means is large enough to essentially confine the energy within the electrode. Due to the grating configuration by the inter-digitated comb electrodes and in the presence of an alternating electrical polarity, some vibration is nevertheless induced within the piezoelectric layer that leads to a coherence between the vibrations of the electrodes, which leads to the resonance phenomenon but still guidance of the mode can be obtained.

The operating acoustic wavelength $\lambda$ of the transducer is linked to the resonant frequency $f_r$ of the transducer structure as $f_r = v/2p = v/\lambda$, v being the acoustic wave propagation velocity in the acoustic wave propagating substrate.

Figure 2:
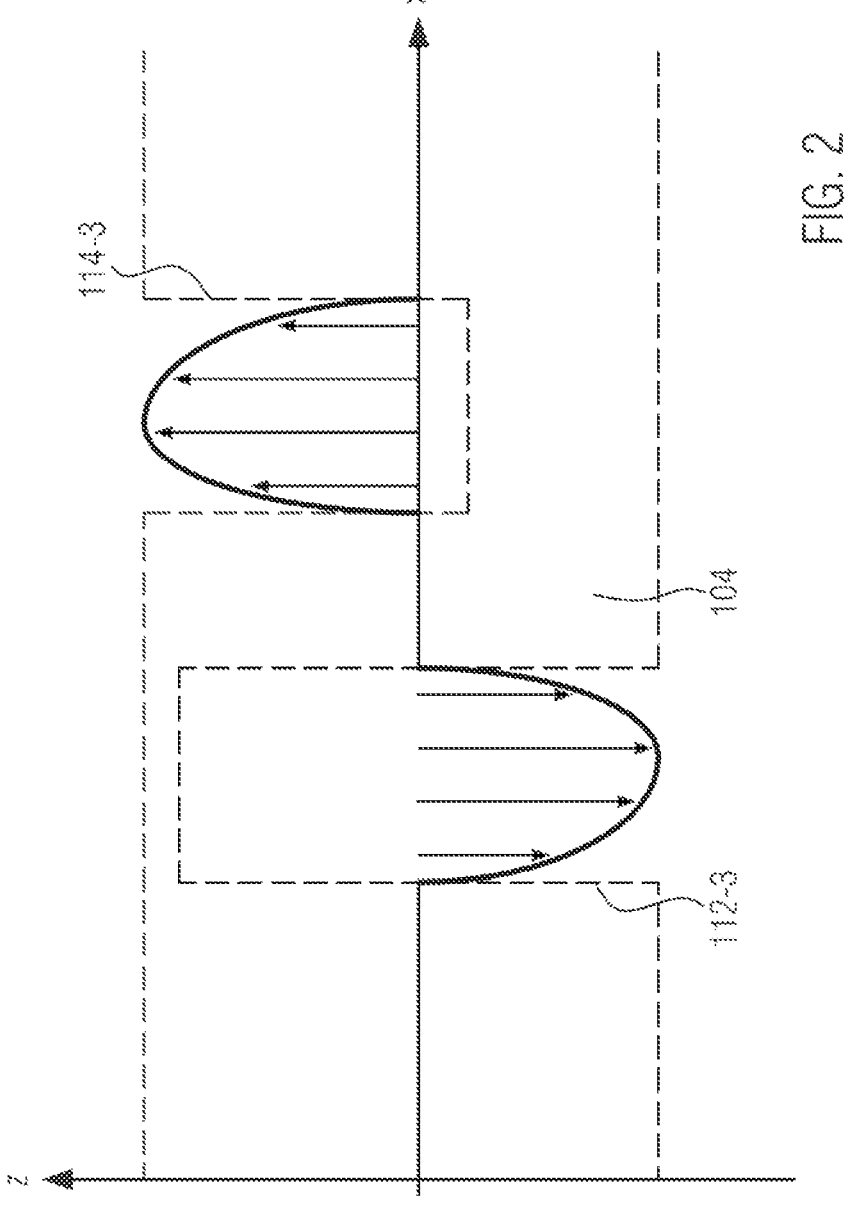
FIG. 2 illustrates schematically the mode obtained with the transducer structure illustrated in FIG. 1.

The mode is schematically illustrated in FIG. 2, which is a top view onto the transducer structure 100 and the two neighboring electrode means 112_3 and 114_3. Numerical simulations were realized, see S. Ballandras et al, Finite-element analysis of periodic piezoelectric transducers Journal of Applied Physics 93, 702 (2003); https://doi.org/10.1063/1.1524711 and have evidenced the excitation of this mode in which shear movement is concentrated within the electrode means. Actually, shear motion is also present within the piezoelectric layer 104, the larger vibration magnitude occurs, however, in the electrodes with alternate vibration direction from one electrode to the other compared to the vibration magnitude in the piezoelectric layer 104.

Figure 3A:
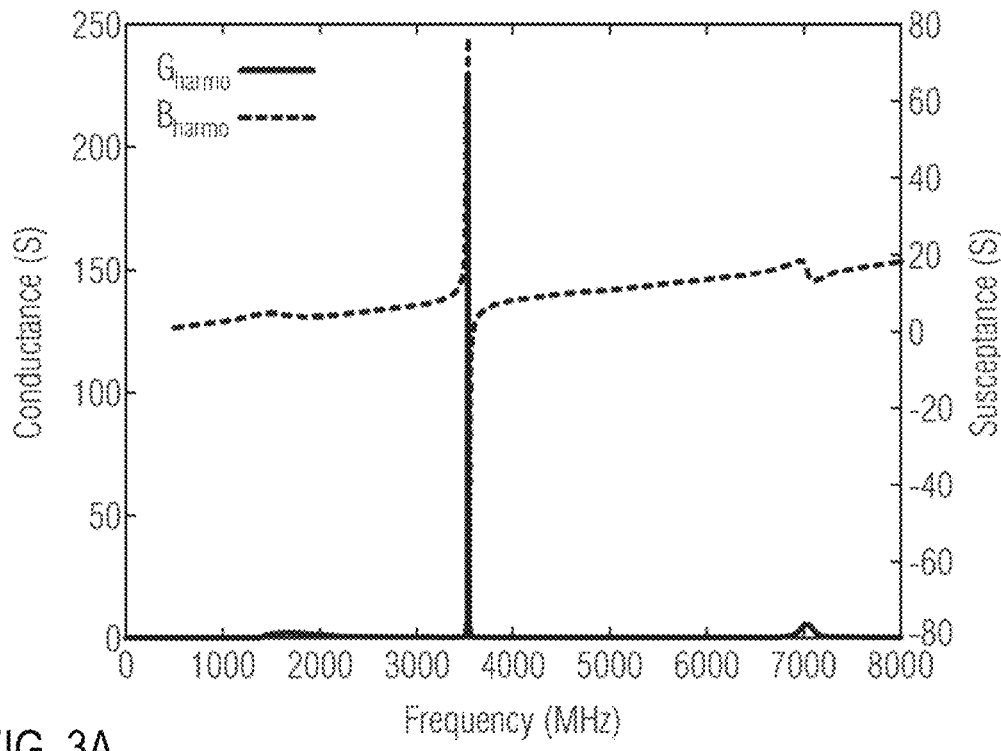
FIG. 3A shows the simulated wide band harmonic admittance of an excited mode according to an example of the first embodiment of the present disclosure.

FIG. 3A shows the simulated wide band harmonic admittance of an excited mode according to a first example of the first embodiment of the present disclosure.

For this embodiment, the transducer structure comprises Al—Cu electrodes embedded in a LiTaO$_3$ piezoelectric layer over a silica substrate. The wavelength $\lambda$ of the transducer structure is equal to 2.8 μm, thus p=1.4 μm and the aspect ratio a/p of the electrodes is equal to 0.43. In this embodiment, like illustrated in FIG. 1, the electrodes 112_i, 114_j are embedded in the piezoelectric layer 104 and represent a continuous material from a geometrical point of view although physical properties of the resulting layer are periodically distributed.

As can be seen from the results illustrated below, the signature of the mode is similar to a leaky-SAW propagating at an equivalent phase velocity about 9850 m·s$^{-1}$, thus higher than the surface skimming bulk wave (SSBW) in silicon dioxide, being typically around 3750 m·s$^{-1}$. Indeed, considering the electrical period of the structure to be 2.8 μm with a metallization ratio a/p of around 0.43 and the resonance frequency of 3.45 GHz, an equivalent velocity of about 9850 m·s$^{-1}$ is achieved. The velocity of the mode is obtained by the product of the resonance frequency 3.45 GHz times the electrical period 2.8 μm. The velocity of the mode is computed as the sum of frequencies at the beginning and at the end of the stopband times the mechanical period, see further below.

FIG. 3A shows the simulation data obtained for a configuration in which the shear mode of the electrodes, as already illustrated in FIG. 2, is excited. The graph represents the conductance G in S units on the left Y axis and the
susceptance B in S units on the right Y axis, as a function of
the frequency in MHz on the X axis, for both G harmonic
and B harmonic. As can be seen, a wide band harmonic
admittance is observed, with a shear resonance at 3.45 GHz.
The shear resonance at 3.45 GHz is the predominant excited
mode. Furthermore, two much smaller contributions can be
seen around 1.5 GHz and around 7 GHz.

Figure 3B:
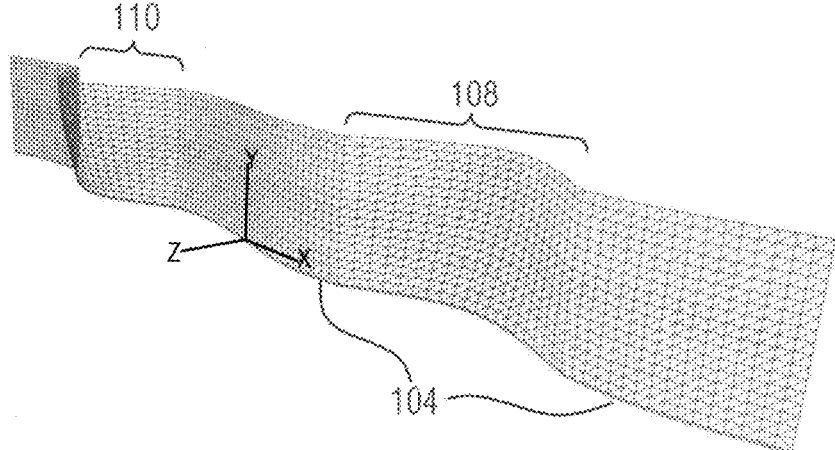
FIG. 3B shows a mesh view illustrating the vibration of the mode observed.
Figure 3C:
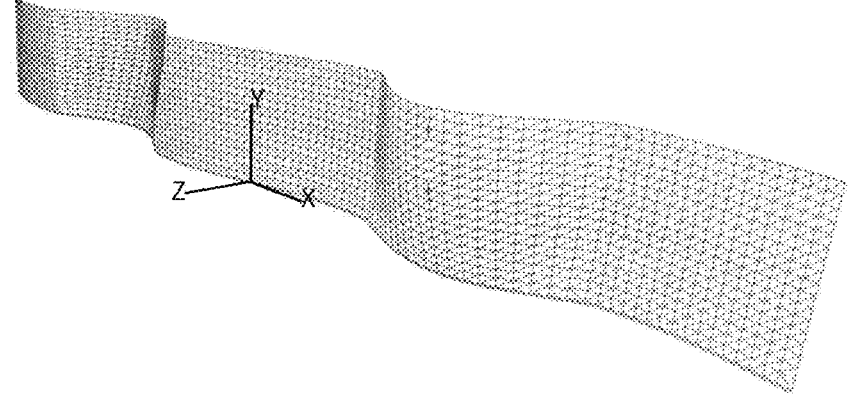
FIG. 3C shows a mesh view illustrating the vibration of the mode at phase opposition.

FIGS. 3B and 3C illustrate deformations inside the struc-
ture of the transducer. The movement is concentrated to the
area of the inter-digitated electrodes 108, 110 only. The
vibrations in the piezoelectric layer 104 were almost not
visible in the simulation.

According to the present disclosure, the above-mentioned
parameters were such that a shear bulk acoustic mode is
excited predominantly within the metal electrode means
112_i, 114_j, polarized in the y direction and yielding a
displacement in the z direction. The useful E field extends
along the x direction. Thus, the vibration is mainly located
within the electrodes with a deformation close to the fun-
damental shear bulk wave of the electrode itself. Although
shear motion is also observed within the piezoelectric layer
104, the largest vibration magnitude occurs in the electrodes
112_i, 114_j with alternate vibration direction.

The shear displacement direction is alternated from one
electrode to another when the transducer structure 100 is
excited by a +V/−V electrical polarization structure. This
opposition in phase of the electrodes increases the accumu-
lation of charges at the edge of the electrodes, thus increas-
ing the excitation of the bulk mode in the electrodes 112_i,
114_j. The piezoelectric layer 104 is confining stresses on
the electrode edges and the coherence of the vibration occurs
when satisfying boundary conditions along the grating since
the transducer structure operates at the Bragg conditions.
Although shear motion is also present within the piezoelec-
tric layer 104, the largest vibration magnitude occurs in the
electrodes with alternate vibration direction from one elec-
trode to the other.

The predominant acoustic wave propagating in the trans-
ducer structure is thus a bulk shear wave that is essentially
confined within the electrodes 112_i, 114_j. The resonant
frequency f_r of the transducer structure 100 is given by
f_r=v/2p=v/v being the acoustic wave propagation velocity in
the acoustic wave propagating substrate and A the operating
acoustic wavelength of the transducer.

Since the bulk acoustic wave in the electrode means has
a resonance at higher frequency than the guided wave of the
fundamental shear mode in the piezoelectric layer, this
transducer structure can work at higher frequencies, in
particular, above 3 GHz. Thus, higher frequencies than with
prior art devices can be exploited, without the need to use
more sophisticated lithography tools to move to smaller
features than the ones currently used in SAW industry,
particularly I-line lithography stepper.

A main aspect of the present disclosure is thus that this
type of structure enables the excitation of a shear mode
mainly located in the electrode, resembling a shear bulk
mode confined within the electrode means, as explained
above. The electrode mode can be qualified as a pseudo or
leaky mode, which is confined with a leakage that is reduced
but not totally suppressed, which leads to the synchroniza-
tion between electrodes. This mode exhibits an equivalent
velocity much larger than what is achievable with state of
the art inter-digitated transducer structures on composite
substrates exploiting the shear mode in the piezoelectric
layer. The other modes are much lower in intensity or even
suppressed, which is mainly due to the use of the silica substrates with the low SSBW velocity therefore allowing
the standard shear mode to dissipate.

The inventive configuration can be understood as an
individual resonator network or grating, wherein the reso-
nators are coupled via the piezoelectric layer, therefore even
though the phase velocity is higher than compared to the
fundamental shear mode, dissipation into the substrate is
prevented, at least to a large extent, comparable thus to leaky
modes.

Figure 3D:
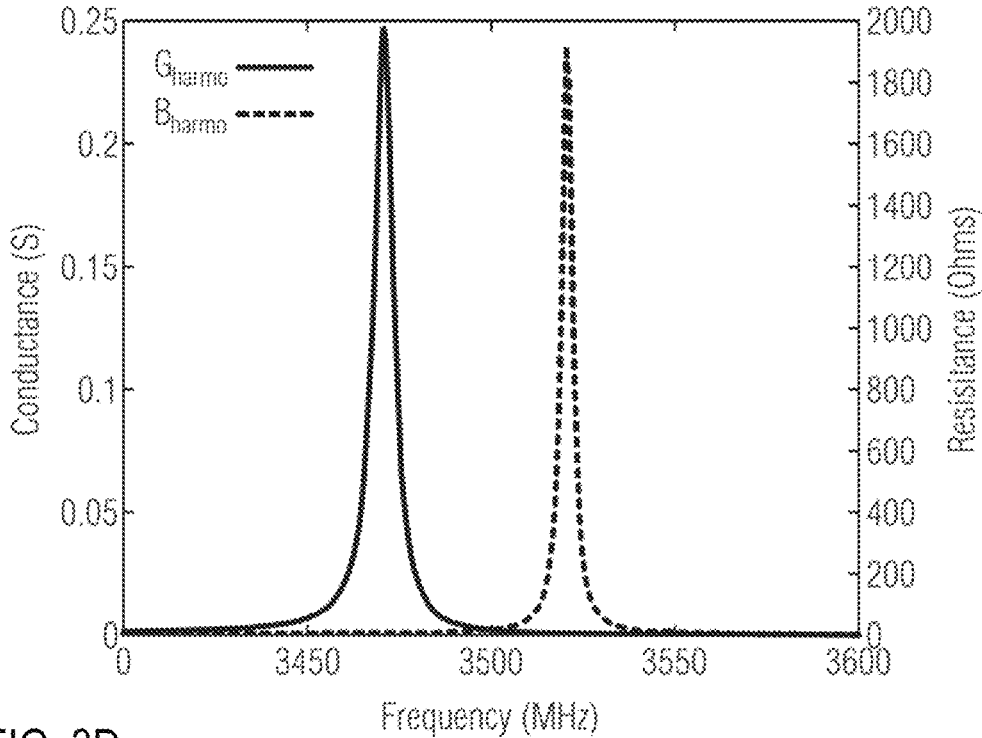
FIG. 3D shows a zoom of the simulated wide band harmonic admittance of the excited mode as shown in FIG. 3A.

FIG. 3D shows a zoom of the simulated wide band
harmonic admittance of the excited mode shown in FIG. 3A,
according to the first embodiment of the present disclosure.

The graph shown in FIG. 3D represents the conductance
in S unit on the left Y axis and the susceptance in S unit on
the right Y axis, for a frequency range between 3400 to 3600
MHz on the X axis, for both G harmonic and B harmonic.
A resonance around 3.475 GHz and an anti-resonance
around 3.525 GHz can be seen. The resonance and anti-
resonance are well separated and give a coupling factor of
about 3%. The resonance also takes place at the beginning
of the stop-band.

In this particular case, a reflection coefficient of about 9%,
a quality factor Q of the resonance of about 500, and for
anti-resonance of about 1000 are achieved.

The coupling factor can be improved by modifying the
characteristics of the transducer structure, such as the aspect
ratio a/p, the thickness of the electrodes and the materials
used. In particular, the aspect ratio a/p and the thickness of
the electrodes enable to control the velocity, the electrome-
chanical coupling, the quality factor or radiation losses and
the reflection coefficients.

Figure 3E:
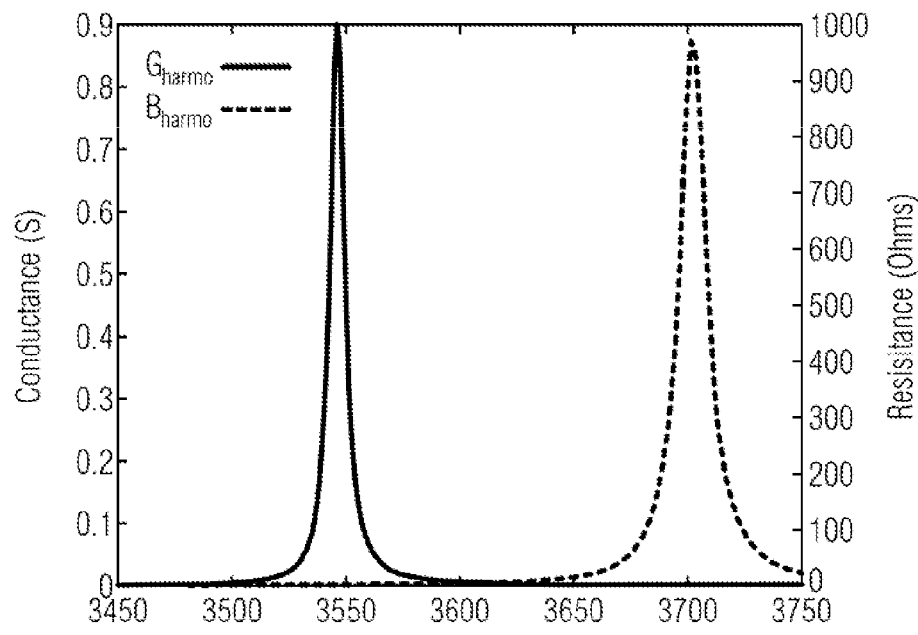
FIG. 3E shows the conductance and resistance of the excited mode.

FIG. 3E shows the conductance and resistance of the
excited mode for a variant of the first embodiment obtained
for the same material choice but an aspect ratio a/p of 0.57.

Also in this configuration, the shear mode concentrated
inside the electrodes is excited. The graph represents the
Conductance in S unit on the left Y axis and the Susceptance
in S unit on the right Y axis, for a frequency range between
3450 to 3750 MHz on the X axis, for both G harmonic and
R harmonic. A resonance around 3550 GHz and an anti-
resonance around 3700 GHZ is obtained.

In this case, increasing the aspect ratio a/p from 0.43 to
0.57 leads to an increase in equivalent phase velocity of the
propagating mode to more than 10 km·s$^{-1}$ and to an increase
in coupling factor to more than 10%. However, the reflection
coefficient is now less than 5%. At resonance, the Q factor
is still equal to 500 but at the anti-resonance, the Q factor is
now equal to 350.

Figure 3F:
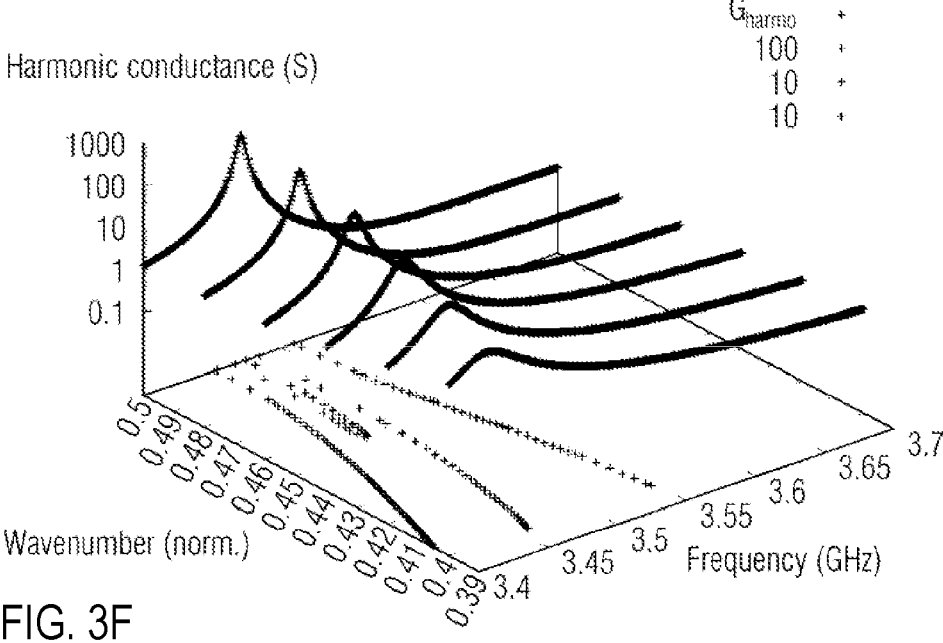
FIG. 3F shows the dispersion properties of the excited mode.

FIG. 3F illustrates the dispersion properties of the excited
mode as illustrated in FIG. 3A, according to the first
embodiment of the present disclosure. In that case, the
admittance is calculated for various normalized wavelengths
near a value of 0.5 corresponding to the edge of the first
Brillouin zone, which is also identified as the Bragg condi-
tion. For normalized wavelengths smaller than 0.5, the mode
is less efficiently excited as one can see on the curve and at
lower frequency. Considering this and by plotting the evo-
lution of the maximum admittance modules versus fre-
quency and normalized wavelength, the projected 2D rep-
resentation is obtained recalling the classical dispersion
curve of any wave propagation in a periodic lattice. As can
be seen, the resonance occurs at the beginning of the
stop-band.

The choice of the substrate is important when other modes
than the shear mode concentrated in the electrodes have to
be suppressed or at least are only weak compared to the
desired mode. As mentioned above, this condition is obtained when SSBW velocity in the substrate is lower than velocity of the fundamental shear mode in the piezoelectric layer. In this case, the fundamental shear mode will penetrate the substrate and its energy becomes dissipated.

Furthermore, the acoustic impedance should be close to the one of the piezoelectric layer to favor the mode.

Other substrates with a high acoustic wave propagation velocity equal or larger than 4500 m·s$^{-1}$, like silicon, diamond, sapphire, silicon carbide or aluminum nitride may still be used but in that case the bulk shear mode can exist besides the mode of interest concentrated in the electrodes.

That is also why it is not mandatory to use a composite substrate. Even bulk piezoelectric substrates of Lithium Tantalate or Lithium Niobate might be used with electrodes embedded in the surface area. Even in this case the electrode mode can be observed.

Figures 3G, 3H:
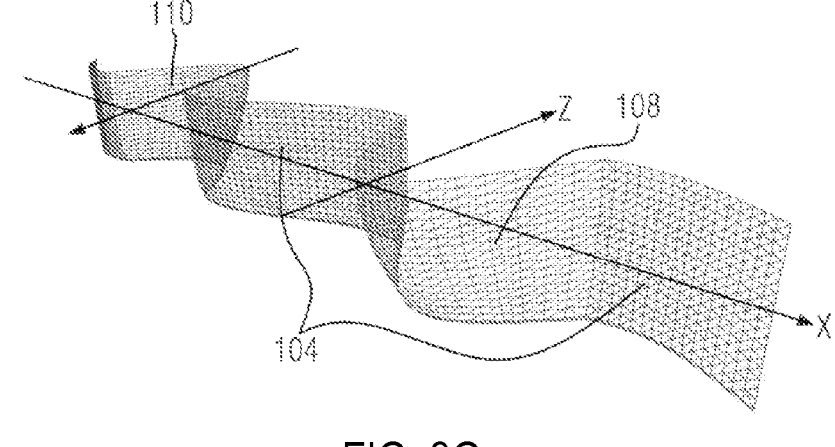
FIGS. 3G and 3H illustrate deformations inside another example of an acoustic wave device according to the first embodiment.

FIGS. 3G and 3H illustrate deformations inside another example according to the first embodiment. Here the shear movement is less concentrated to the area of the inter-digitated electrodes 108, 110, but still predominant only. The vibrations in the piezoelectric layer 104 were almost not visible in the simulation.

For this example of the embodiment, the transducer structure comprises Al—Cu (2% Cu) electrodes embedded in a LiTaO$_3$ (YXl)/42° piezoelectric layer over a silica substrate. The wavelength λ of the transducer structure is equal to 2.8 μm, thus p=1.4 μm and the aspect ratio a/p of the electrodes is equal to 0.5, with a groove depth of t$_e$/λ=20%. In this embodiment, like for the first example illustrated in FIG. 1, the electrodes 112_i, 114_j are embedded in the piezoelectric layer 104.

FIG. 3H is a view of the mode in the xz-plane illustrating that the electrode mode meets the above mentioned synchronism condition f=v/2p as indicated by reference numeral 130. FIG. 3H shows that the shear movement inside the electrodes 108, 110 is characterized by two neutral vibration points 132 in each electrode 108, 110. Furthermore the edges 134a, 134b, 136a, 136b of each electrode 108, 110 move synchronously. This indicates that within one electrode 108 or 110, electrical charges of the same sign are present at both interfaces.

Figure 4:
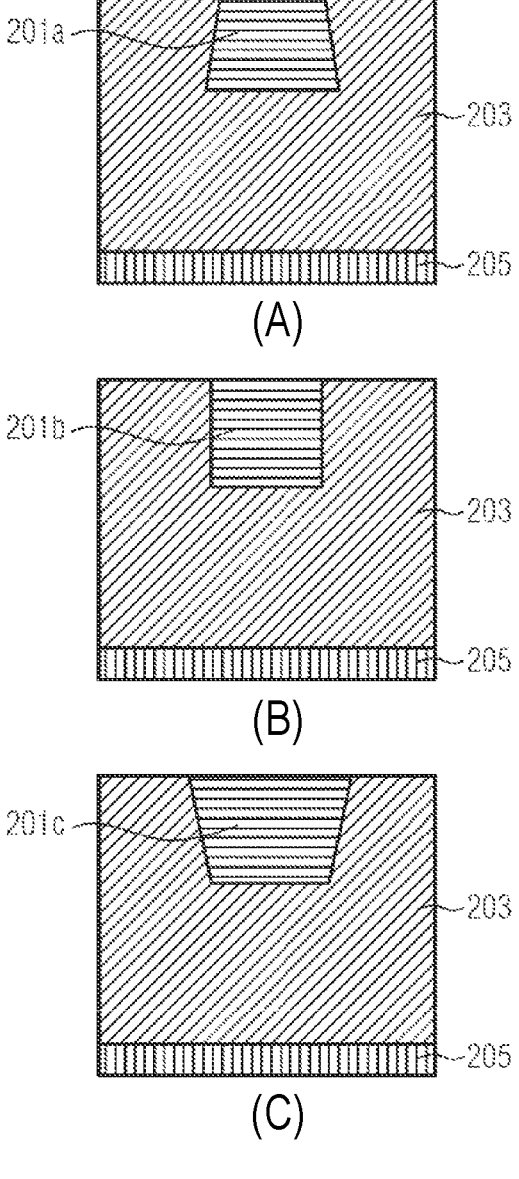
FIGS. 4A to 4C illustrate three different electrode shapes within a piezoelectric layer, FIG. 4A according to a second embodiment, FIG. 4B according to the first embodiment and FIG. 4C according to a third embodiment.
FIG. 4D illustrates the harmonic susceptance corresponding to the three different electrode geometries.
FIG. 4E illustrates the harmonic conductance corresponding to the three different electrode geometries.
FIGS. 4F to 4H illustrate further variants of electrode shapes with concave, convex or scalloped sidewalls.
FIGS. 4I and 4J illustrate two further variants of electrode shapes, with a dielectric layer in the groove.
Figures 4D, 4E:
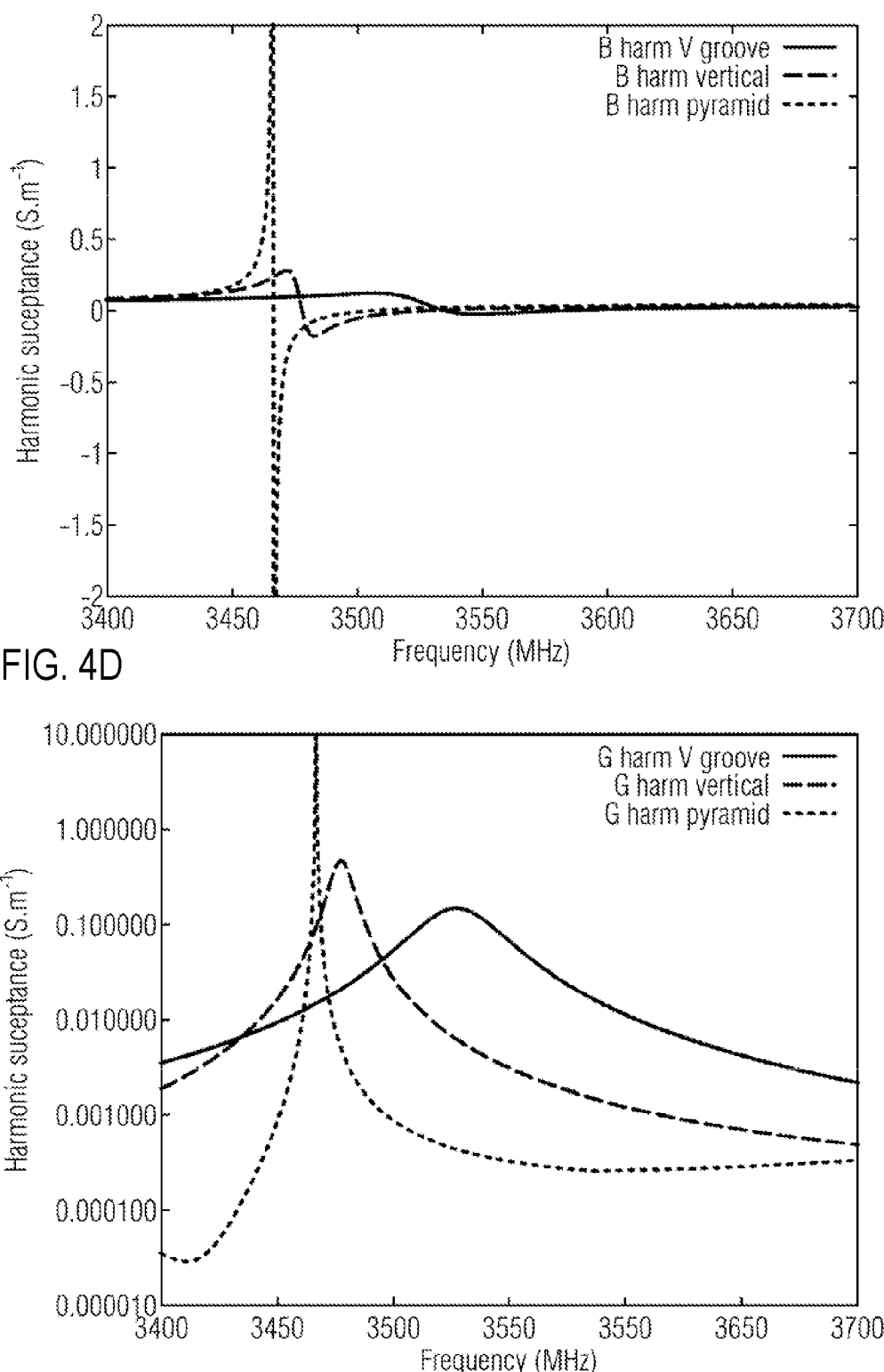
Figure 4F:
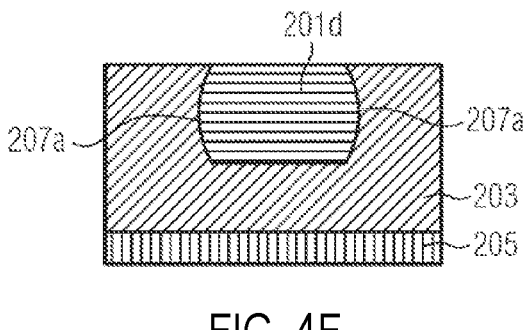

FIGS. 4A to 4C illustrate three variants of such a realization with three different electrode shapes considered for the excitation of the electrode-resonance mode. The figures illustrate a cut view in the x-y plane of FIG. 1 through one electrode means 112_i or 114_j. In all three figures, one mechanical period is represented. The embedded electrodes are filled into grooves in the piezoelectric layer. For simulation purposes (the results are illustrated in FIGS. 4D and 4F), the grating is assumed infinitely long and excited by a harmonic +V/−V excitation. The electrodes radiate energy into the bulk substrate from their bottom interface with the substrate.

The Al electrode 201a, 201b, 201c is respectively represented by horizontal crosshatch, the piezoelectric layer 203, here LiTaO$_3$, is in inclined crosshatch and the bottom layer 205 in vertical crosshatch, which can be either SiO$_2$ or another interface material or the same material as the piezoelectric layer 203.

FIG. 4A illustrates a second embodiment of the present disclosure. Here the groove in the piezoelectric layer 203 has a pyramidal or trapezoidal cross section. The electrode 201a filled into the groove there, according to a second embodiment of the present disclosure, has a pyramidal or trapezoidal type shape in its cross-section. In this embodiment, the shorter side of the parallel sides of the trapeze being aligned with the upper surface of the piezoelectric layer 203.

The electrode 201b, according to the first embodiment as illustrated in FIG. 1, is of a vertical type illustrated in FIG. 4B.

The electrode 201c, according to a third embodiment of the present disclosure, is filled into a groove having a trapezoidal shape but in contrast to the second embodiment, the short side of the parallel side is arranged inside the piezoelectric layer 203 and not at its surface. Thus, the electrode 201c has of a truncated V-shaped type.

Thus, the electrodes fill grooves of varying shape inside the piezoelectric layer 203, which, depending on its thickness, behaves like a bulk material.

The FIGS. 4D and 4E illustrate the results of the simulation and provides a comparison of excitation efficiency of the electrode-resonance mode for the three electrode shapes:

FIG. 4D illustrates the harmonic susceptance and FIG. 4E illustrates the harmonic conductance.

The simulations clearly indicated that the pyramidal shape is of higher interest than the two others with, however, a lower coupling efficiency.

Figure 4G:
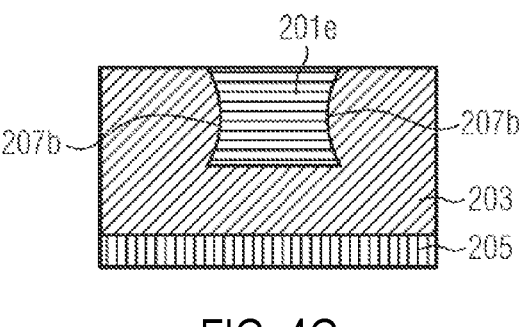
Figure 4H:
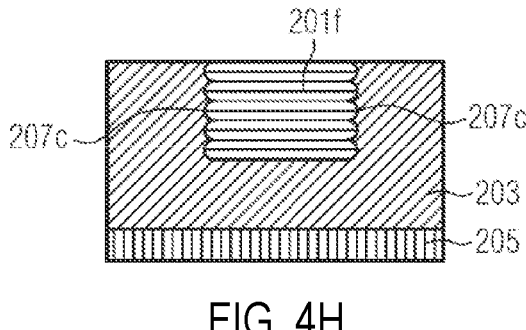

Further design options are illustrated in FIGS. 4F to 4H. The variants are based on the design as illustrated in FIG. 4B but can be adapted to the other embodiments as well.

FIG. 4F illustrates an electrode 201d inside a groove in the piezoelectric layer 203 with sidewalls 207a that have a concave shape. FIG. 4G illustrates an electrode 201e inside a groove in the piezoelectric layer 203 with sidewalls 207b that have a convex shape. FIG. 4H illustrates an electrode 201f inside a groove in the piezoelectric layer 203 with sidewalls 207c that have a scalloped shape. By increasing the surface of the sidewalls, more electrical charges of the same sign can be present at the interface, thereby improving the charge distribution contributing to the mode signature and therefore the strength of the mode excitation. It can also be noted that the Q factor of the mode, e.g., the trapping efficiency, depends on the shape of the electrode. Therefore, it is preferred to optimize both active surface and aspect ratio to improve the operation conditions for the electrode mode.

In addition or as an alternative, the bottom of the grooves could also have convex or concave or scalloped shape.

Figure 4I:
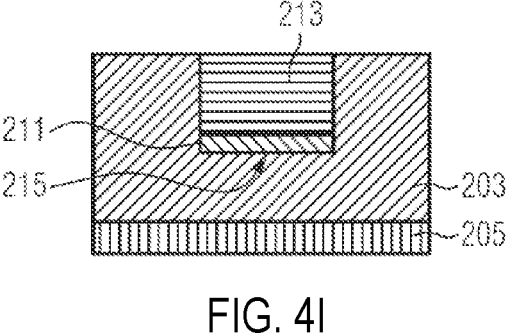

FIG. 4I illustrates a further variant, based on the first embodiment, as illustrated in FIG. 4B, which can also be adapted to the other embodiments and variants. A dielectric layer 211, e.g., Si$_3$N$_4$, is provided on the bottom 215 of the groove in the piezoelectric layer 203. Then the conductive layer 213 of the electrode is provided to fill up the groove. Due to the presence of the dielectric layer 211 no electric charges are present at the bottom of the electrode. Using a dielectric with a higher shear velocity than the conductive material can accelerate the fundamental shear mode so that its phase velocity is beyond the SSBW velocity of the bottom layer so that it becomes better absorbed in the bottom layer 205. This phenomenon will be described in more detail further below with respect to FIGS. 7 and 12.

Figure 4J:
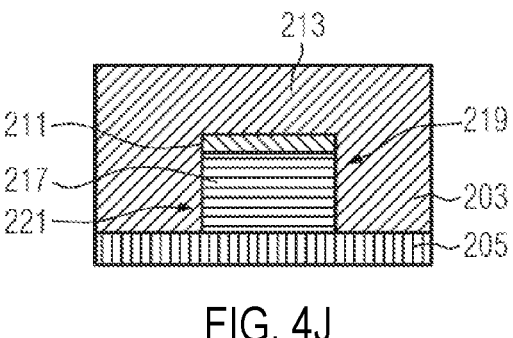

FIG. 4J illustrates a further variant, based on the previous variant. Here the conductive layer 217 is interfacing the bottom layer 205. The dielectric layer 211 is again screening the conductive layer 217 toward the piezoelectric layer 203 so that the conductive layer 217 interfaces the piezoelectric layer only via the sidewalls 219 and 221.

It has been found that in case the conductive material of the electrode has no contact with the piezoelectric material above and below, like illustrated in FIGS. 4I and 4J, parameters like phase velocity, resonance Q factor, reflection coefficient and coupling factor k$^2$ can be optimized compared to comparative structures without such features.

All variants described above with respect to the FIGS. 4A to 4H can be realized according to the variant shown in FIG. 4J with the electrode interfacing the bottom layer 205.

Figure 5:
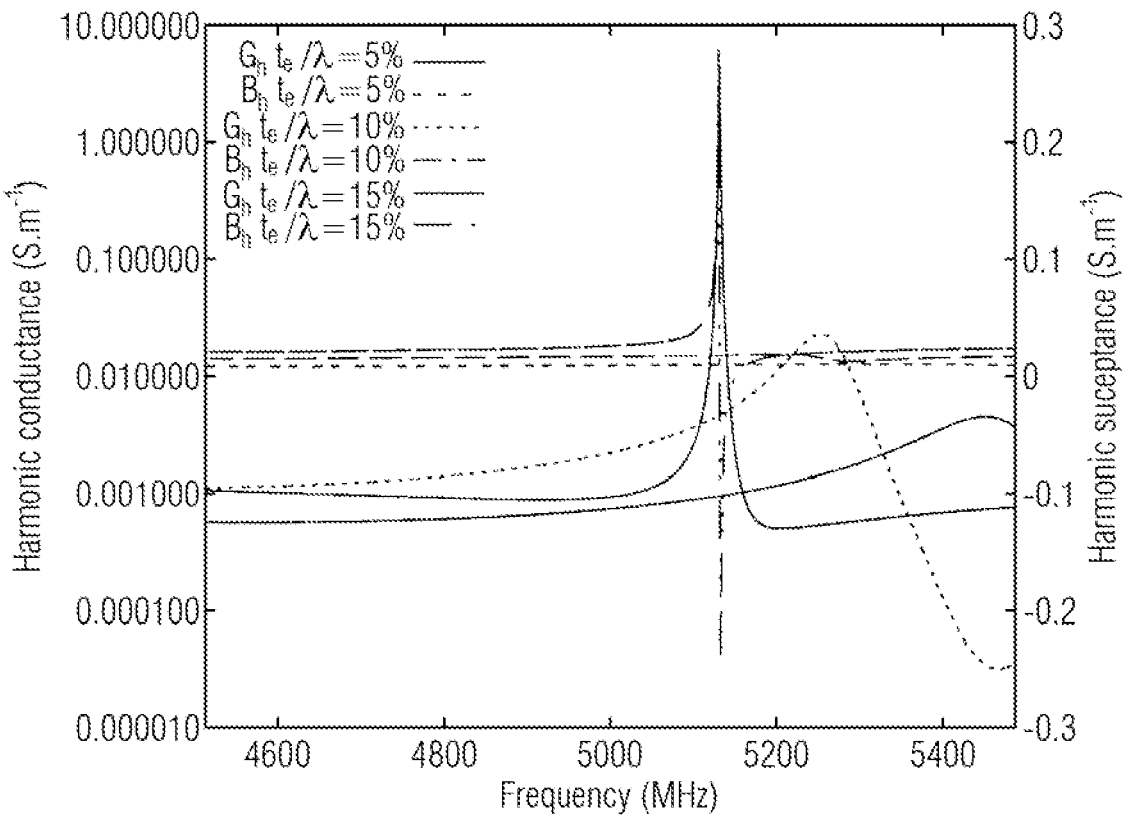
FIG. 5 illustrates the effect of the thickness of the electrodes on the occurrence of the shear mode confined within the electrodes.

FIG. 5 indicates the effect of the thickness of the electrode means 112_i and 114_j on the shear mode within the electrodes. Here the harmonic analysis for aluminum electrodes embedded in a (YX1)/42° Lithium Tantalate piezoelectric layer on a 325 nm thick silicon dioxide layer on Si(100) are illustrated for a 1 μm pitch and a metal/piezoelectric a/p ratio set to 0.35 is presented. FIG. 5 shows the admittance for a relative metal layer height $t_e/\lambda$ from 5% to 15%. One can identify that only starting at a $t_e/\lambda$ ratio larger than 0.1 a resonance can be observed.

Compared to the other examples illustrated above, the resonance occurs at a higher frequency around 5.15 GHz, which is due to the smaller pitch.

Figure 6:
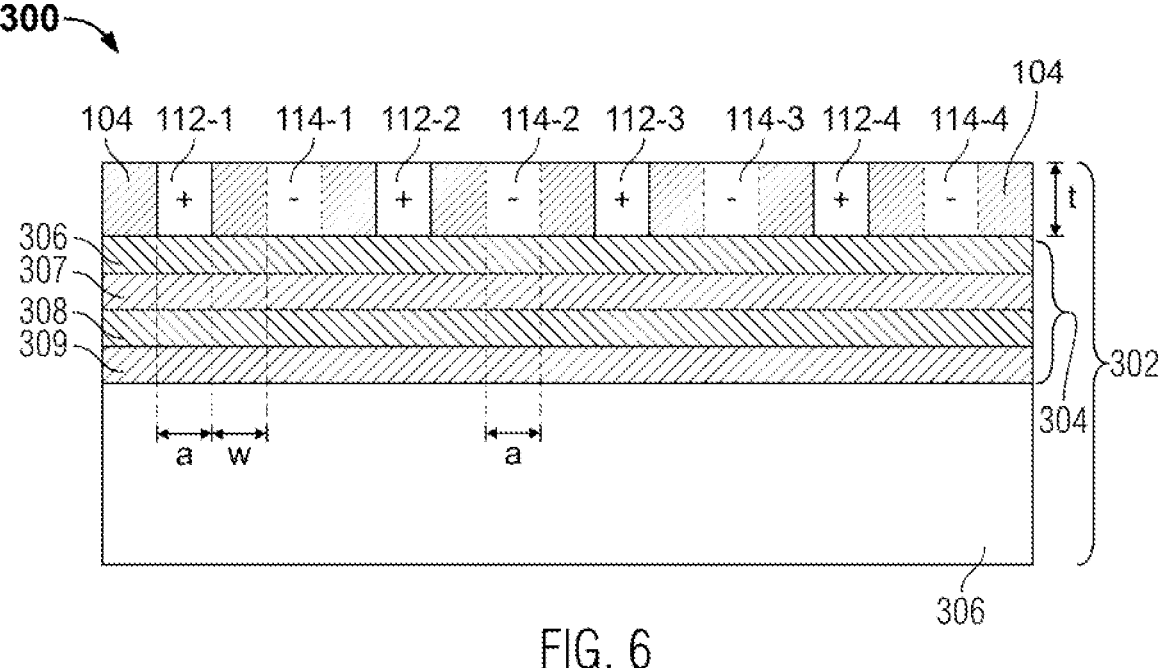
FIG. 6 illustrates an inter-digitated transducer structure for acoustic wave devices according to a fourth embodiment of the present disclosure.

FIG. 6 illustrates an inter-digitated transducer structure for acoustic wave devices according to a fourth embodiment of the present disclosure.

The transducer structure 300 comprises a different acoustic wave propagating substrate 302 in comparison with the substrate 102 of the transducer structure 100 of the first embodiment, which is the only difference with respect to the first embodiment. All other features are the same and will therefore not be described in detail again but reference is made to their description above.

The transducer structure 300 comprises a composite substrate 302 comprising, like the composite substrate 102, a piezoelectric layer 104, formed over the base substrate 306, but furthermore comprises an acoustic mirror 304, also called Bragg mirror, formed above the base substrate 306 and below the piezoelectric layer 104.

The Bragg mirror 304 comprises a plurality of stacked layers 306 to 309, the layers with an even reference numeral 306, 308 being of a first material and the layers with an odd reference numeral 307, 309 being of a second material. The first and second materials have different acoustic impedances, so that the Bragg mirror 304 comprises a stacking of alternating high and low impedance layers.

The Bragg mirror 304 has a periodical repetition of a pair of layers with a thickness of about a quarter of a wavelength with alternating high/low impedances, to ensure the reflection.

The first and second materials can be chosen amongst Tungsten, Molybdenum, LiTaO₃, Al₂O₃, AlN, LiNbO₃, Si₃N₄ and any combination of SiO₂ and Si₃N₄ (known as silicon oxy-nitride and noted $SiO_xN_y$ with x and y controlling the amount of each element in the compound) and ZnO, aluminum or SiO₂.

In a variant, the first material and the second material can be exchanged so that the first material has a low impedance and the second material has a high impedance.

In this embodiment, the Bragg mirror 304 is represented as having four layers 306-309 forming the stack of alternating high and low impedance layers. However, in another variant, the Bragg mirror 304 can also have more or less than four layers of alternating high and low impedance forming the stack.

Increasing the number of pairs in a Bragg mirror 304 increases the mirror reflectivity and increasing the impedance ratio between the materials in the Bragg pairs increases both the reflectivity and the bandwidth. A common choice of materials for the stack is, for example, Titanium dioxide and silica.

According to the present disclosure, the piezoelectric layer 104 and the Bragg mirror 304 are arranged such as to reduce the contributions of additional modes present in the structure, to promote a unique mode within the transducer structure 100 to ensure the spectral purity of an acoustic wave device based on such transducer structure 100, preventing spectral pollution.

One approach is to optimize the thicknesses of the stack of the Bragg mirror 304 to promote the unique mode within the transducer structure, and to realize an efficient reflection coefficient for this mode. The Bragg mirror 304 thus acoustically isolates vibrations generated within the electrode means 112, 114 from the base substrate 106.

Figure 7A:
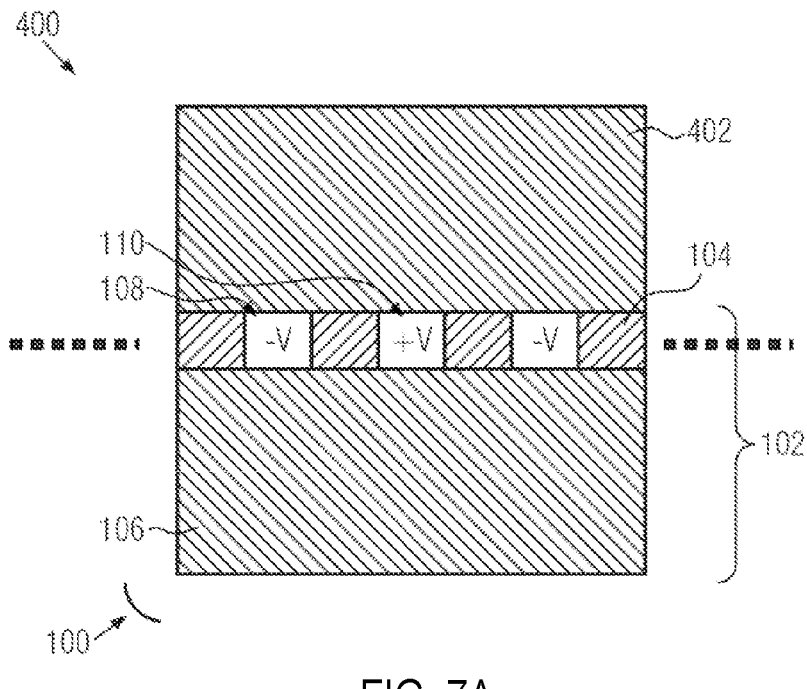
FIG. 7A illustrates an inter-digitated transducer structure for acoustic wave devices according to a fifth embodiment of the present disclosure.

FIG. 7A illustrates an inter-digitated transducer structure for acoustic wave devices according to a fifth embodiment of the present disclosure.

The transducer structure 400 comprises a covering layer 402 on top of the transducer structure 100 of the first embodiment, which is the only difference with respect to the first embodiment. All other features are the same and will therefore not be described in detail again but reference is made to their description above.

The transducer structure 400 comprises a composite substrate 102 comprising a piezoelectric layer 104 formed over the base substrate 106.

In this embodiment of the present disclosure, a layer 402 is present on top of the embedded electrodes 108, 110 and of the piezoelectric layer 104. The layer 402 can be a passivation layer or a guiding substrate, comprising a high velocity low loss material such as Silicon, Sapphire Al₂O₃, Garnets i.e., Yttrium-based materials, aluminum nitride AlN, silicon carbide SiC, silicon nitride Si₃N₄.

According to a further variant, layer 402 could also be a carbon based layer, e.g., single-crystal diamond, an amorphous carbide layer, nano-grain polycrystal diamond (NCD) or an all diamond like carbon layer that could push compressional wave velocity above 15 km·s⁻¹ and shear wave velocity above 7 km-s⁻¹. In yet another variant, a layer of SiO₂ can be used as layer 402. SiO₂ can play the role as a TCF corrector, to improve the TCF value of the overall structure.

The covering layer 402 can also be made of glass, e.g., as TCF corrector, and in general Silicon based-substrates.

Using a high velocity low loss material accelerates the phase velocity of the fundamental shear wave mode above or further above the SSBW velocity of the base substrate so that the unwanted mode can be suppressed by dissipation into the base substrate 106.

In the embodiment shown in FIG. 7A, the covering layer 402 is made of the same material as the base substrate 106 of the composite substrate 102. However, the covering layer 402 can be different from the base substrate of the composite substrate.

According to a further variant, the layer 402 can be present only on top of the electrode means 108, 110, or only on top of the piezoelectric layer 104.

Figure 7B:
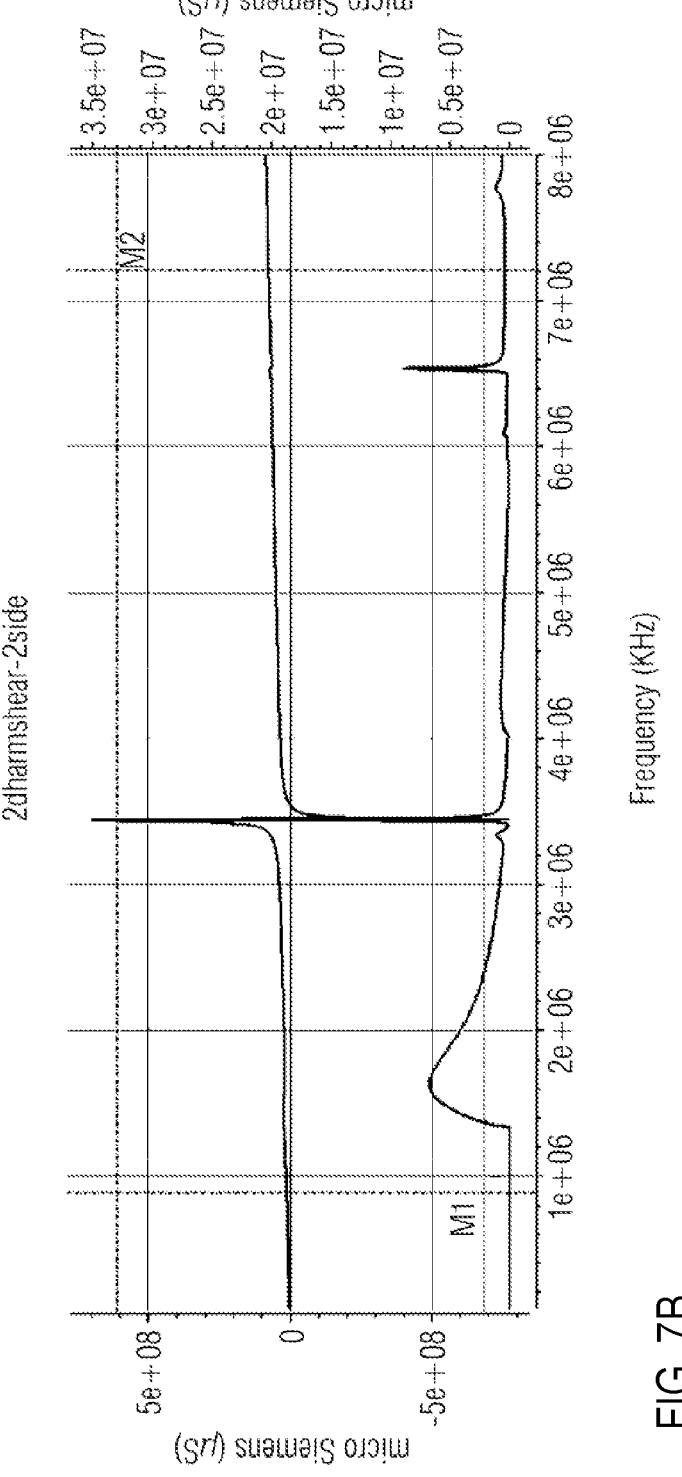
FIG. 7B shows the simulated wide band harmonic admittance of an excited mode according to the fifth embodiment of the present disclosure.
Figure 7C:
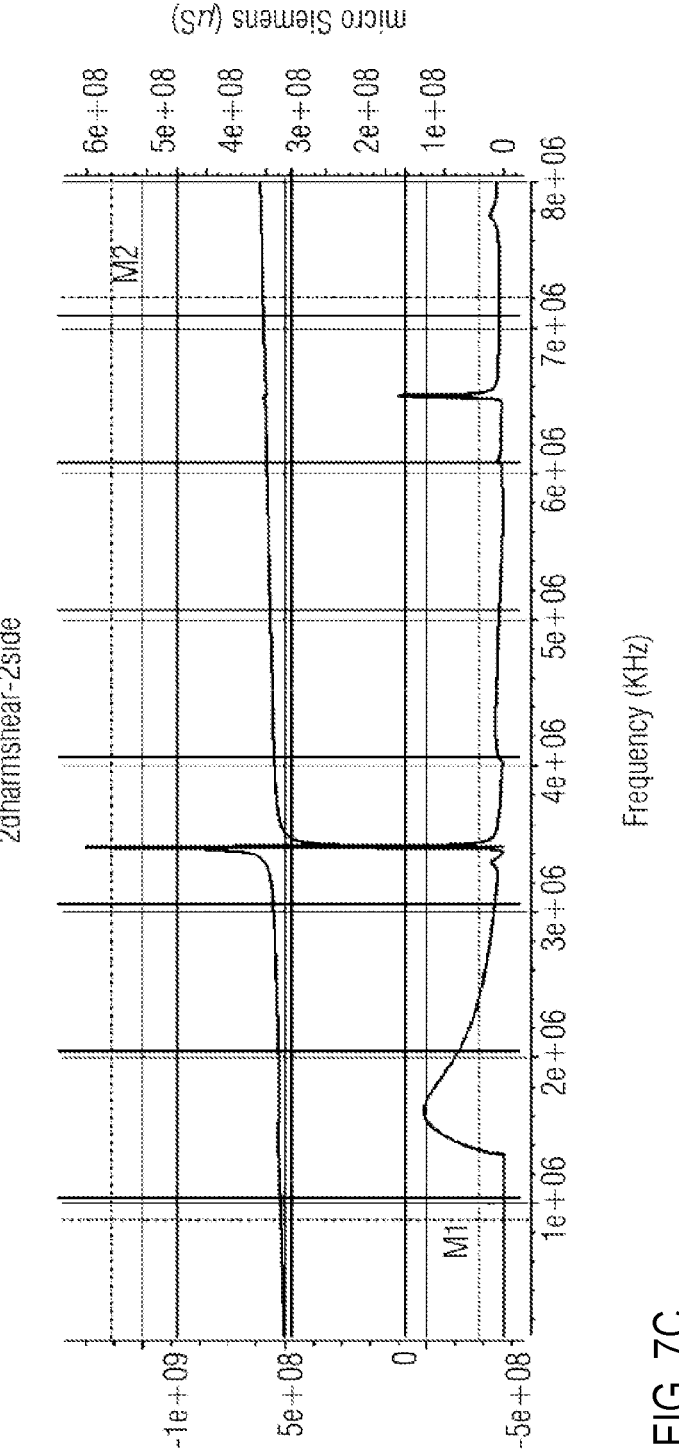
FIG. 7C shows the simulated wide band harmonic admittance of an excited mode according to a variant of the fifth embodiment of the present disclosure.
Figure 7D:
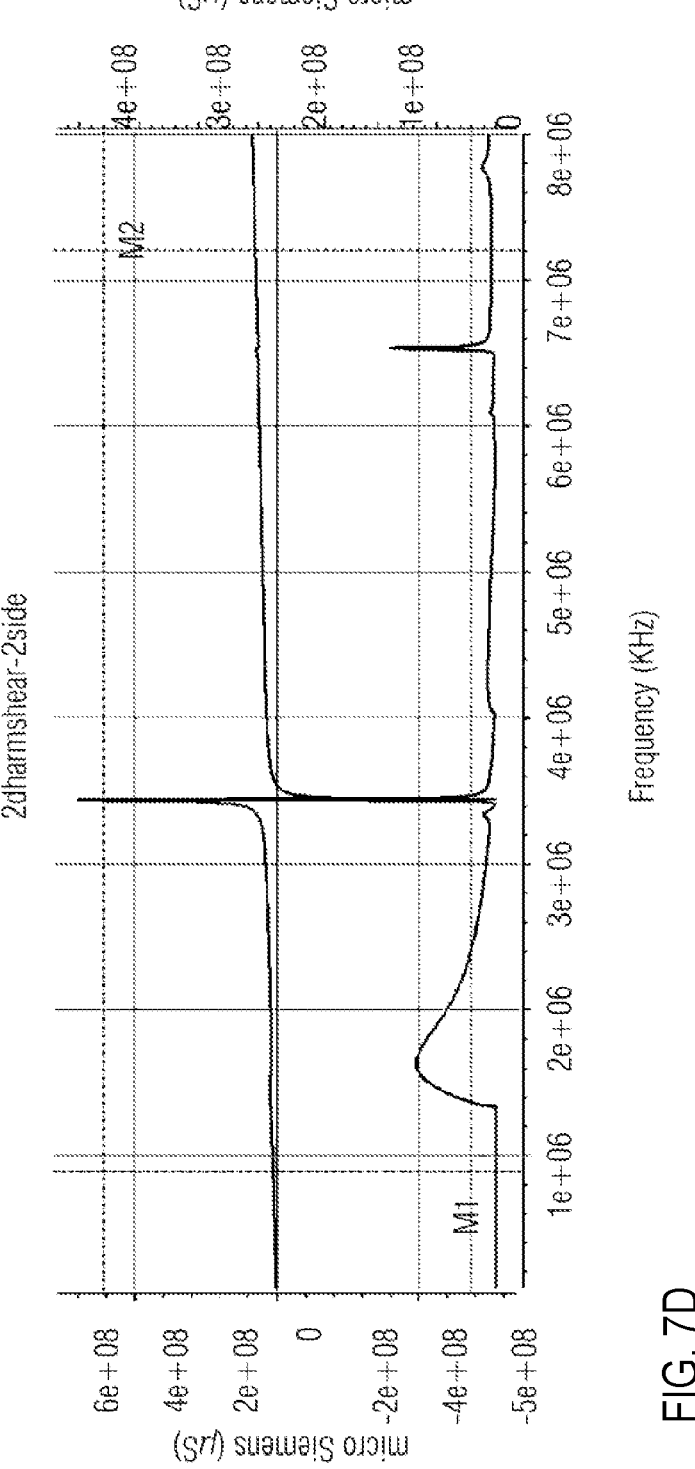
FIG. 7D shows the simulated wide band harmonic admittance of an excited mode according to a variant of the fifth embodiment of the present disclosure.

FIG. 7B to FIG. 7D show the simulated wide band harmonic admittance of an excited mode according to the fifth embodiment of the present disclosure for an acoustic wavelength of 2.8 μm, an a/p ratio of 0.5 with aluminum electrodes and (YX1/42°) Lithium Tantalate as the piezoelectric layer 104.

For FIG. 7B, the covering layer 402 and the base substrate 106 is silicon dioxide. The excited mode occurs at 3.5 GHz. For FIG. 7C, the covering layer 402, the base substrate 106 and the piezoelectric layer 104 is (YX1/42°) Lithium Tantalate. The excited mode occurs as well at around 3.5 GHz. There is a further contribution visible at about 6.5 GHz, which can be attributed to a third harmonic. It is, however, essentially present in the conductance, the corresponding susceptance has no sign change, indicating low coupling.

For FIG. 7D, the covering layer 402 and the base substrate 106 is a Silicon substrate. The excited mode occurs at 3.5 GHz, but here the fundamental shear mode in the piezoelectric layer is also excited and visible at lower frequency, namely at about 1.8 GHz.

The present disclosure also relates to an acoustic wave device comprising two transducer structures each one according to any one of the first to fifth embodiment of the present disclosure.

In an alternative, only one of the two transducer structures can be a surface acoustic device according to the present disclosure whereas the other one can be according to the state of the art.

The acoustic wave device can be an acoustic wave resonator and/or an acoustic wave filter and/or an acoustic wave sensor and/or a high frequency source. The acoustic device can comprise a radio frequency (RF) supply means configured to drive the transducer structure with an RF signal above 3 GHZ.

Figure 8:
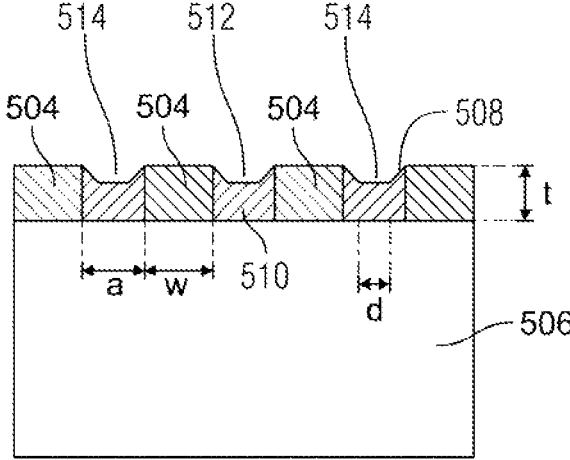
FIG. 8 shows a sixth embodiment of the transducer structure according to any one of the first to fifth embodiments of the present disclosure.

FIG. 8 shows a sixth embodiment of the transducer structure.

The transducer structure 500 of FIG. 8 differs from the transducer structure of FIG. 1 in that the inter-digitated electrodes 512, 514 only partially fill the grooves 510 in the piezoelectric regions 504.

According to the manufacturing process, the thickness of the metallic layer is not constant over the entire removed region 510. Due to surface energy properties, the thickness of the metallic layer at the sidewall 508 is superior to the thickness within the center part.

The transducer structure 500 functions in the same way as the transducer structures described above.

The use of the frequency of the bulk wave propagating in the electrode means of a transducer structure as described above in an acoustic wave device, in particular, for a ladder filter and/or impedance filter and/or coupling filter, allows to generate contributions at high frequency, in particular, above 3 GHz, more in particular, above 3.5 GHz.

Using such embedded electrode means for the transducer structure, the performance of acoustic wave devices as well as their application ranges can be improved compared to bulk piezoelectric substrates without having to change the manufacturing tools, namely I-line lithography.

Figure 9A:
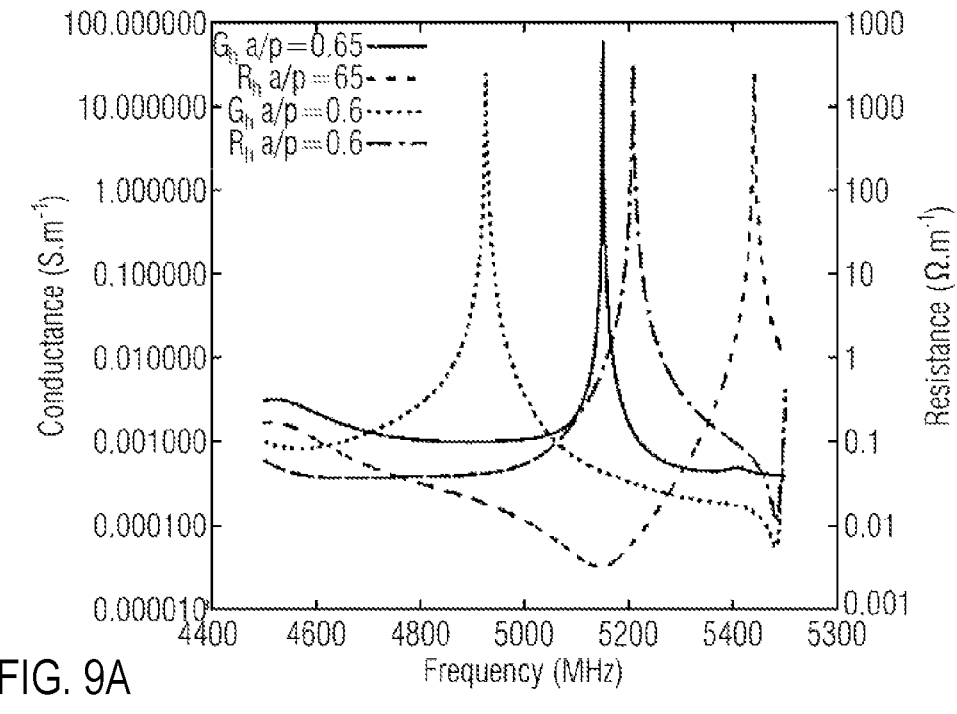
FIG. 9A illustrates a seventh embodiment of the present disclosure and relates to a filter at 5 GHz.
Figure 9B:
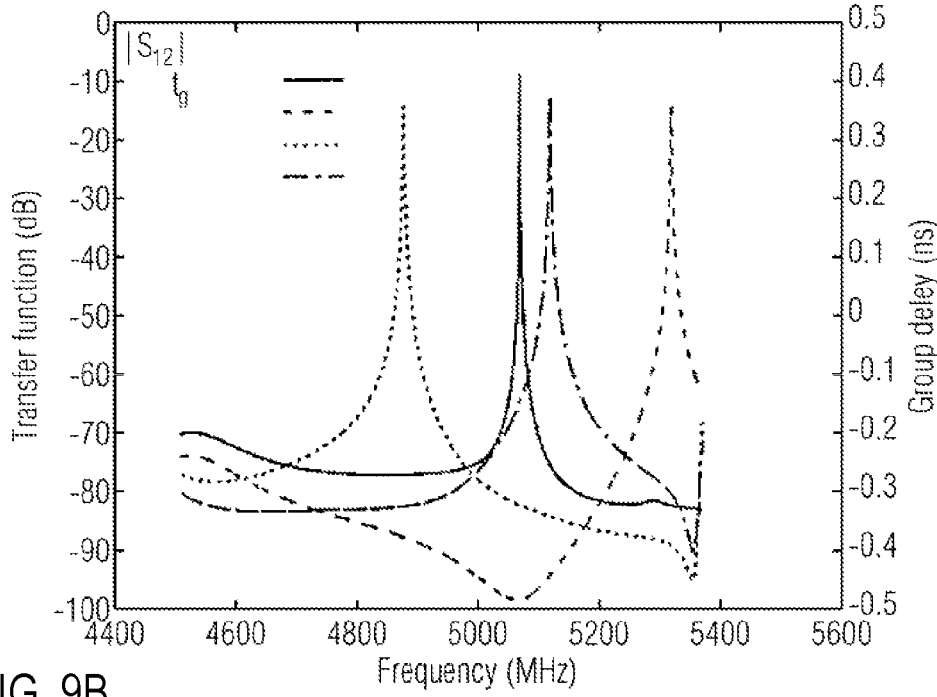
FIG. 9B illustrates the transfer function of the filter according to FIG. 9A.

FIG. 9A and FIG. 9B illustrate as seventh embodiment a practical example of a filter illustrating an effective implementation of the present disclosure according to a typical market demand, e.g., for 5G sub-6-GHz (C-band) filtering. The practical example is based on Al electrodes embedded in LiTaO$_3$ on silica with the following parameters: pitch p=1 μm yielding a wavelength λ of 2 μm thus providing a resonance near 5 GHz, like illustrated in FIG. 5 and a thickness of 700 nm for the electrodes and the piezoelectric layer, thus a ratio of t$_e$/λ of 0.35. According to the usual approach of SAW ladder filter design, the resonance of the series branch occurs at anti-resonance of the parallel branch.

This example according to the present disclosure can be manufactured in a single batch using standard SAW manufacturing technology, e.g., using I-line lithography and a single metal layer deposition. A fine-tuning of the resonance frequencies using the grating pitch p and/or the aspect ratio a/p and/or the t$_e$/λ ratio can be realized. A passivation layer or Bragg mirrors like illustrated in FIG. 7A and FIG. 6 might be used as well to improve the characteristics.

The filter of the practical example is based on the basic transducer structure as illustrated in FIG. 1. Based on that approach, resonators are formed and combined in series and parallel to form cells that can be arranged as cascades or as ladder-filter structures like known in the art.

In the practical example, two gratings of 35% with a respective material ratio a/p=0.6 and 0.65 were used. In both cases, harmonic admittance and impedance were computed and are illustrated in FIG. 9A. The resonance of the a/p=0.65 grating is close to the anti-resonance of the a/p=0.6 grating, which is the prerequisite for the design of a ladder filter as mentioned above.

By combining the responses the transfer function of a 4 it-cell filter as known in the art, can be computed, the result of which is illustrated in FIG. 9B. The transfer function illustrates that an ultra-compact filter operating at more than 5 GHz with electrodes as thick as 700 nm allows improved power handling as the electrodes are embedded according to the present disclosure. In this configuration physical migration is absent. The inventive filter provides a coupling factor k$_s^2$ in excess of 10% for LiTaO$_3$. This could be improved by using LiNbO$_3$ taking into account the scaling between the two materials.

The proposed design shows a bandwidth of 300 MHz. By tuning the resonance-anti-resonance condition an improved match can lead to high band width of the order of 400 MHz as well. Like mentioned above tuning can consist in adjusting the pitch and/or the ratio a/p.

Figure 10A:
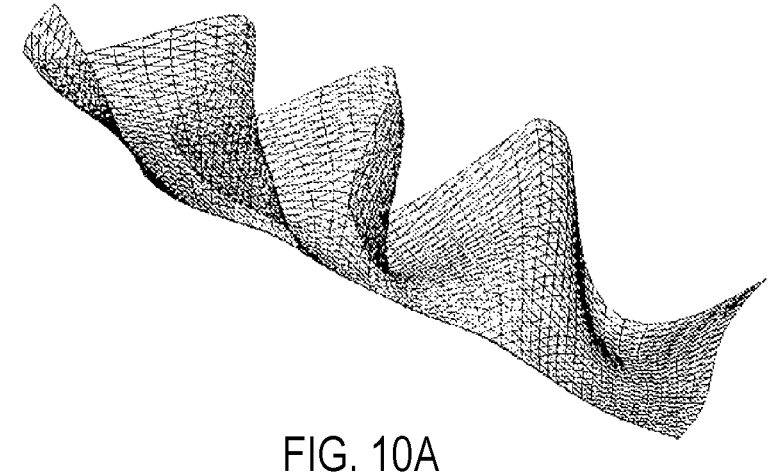
FIG. 10A illustrates a higher order mode according to the present disclosure.
Figure 10B:
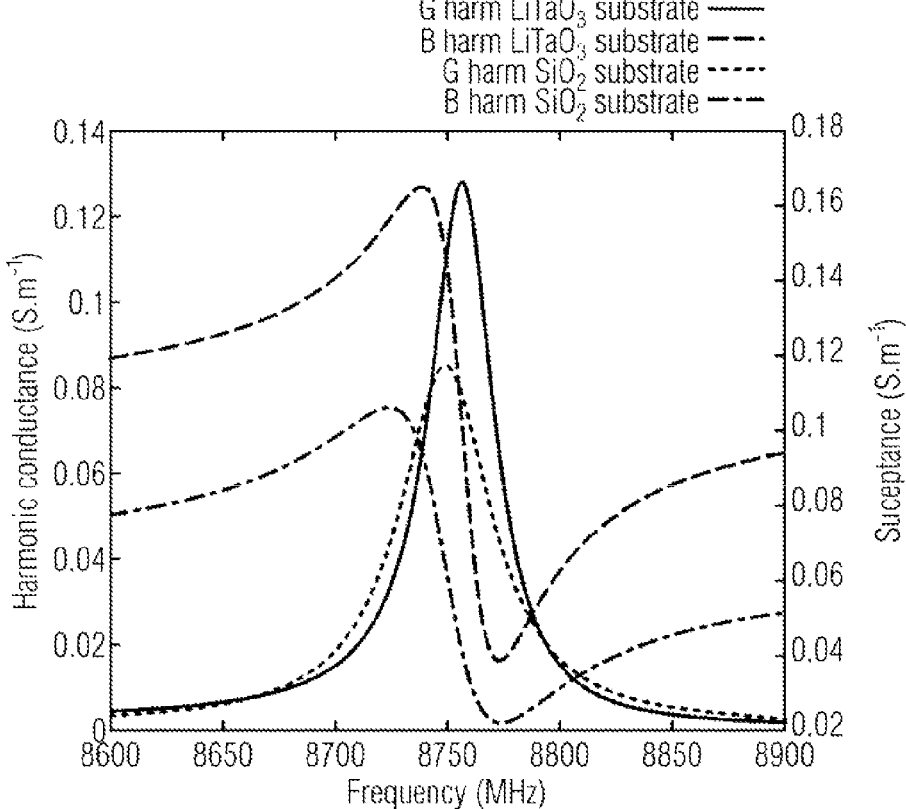
FIG. 10B illustrates the harmonic conductance and resistance of this mode for $LiTaO_3$ and $SiO_2$ substrates.

FIG. 10A illustrates that also higher harmonic modes of the electrode shear mode of the electrodes can be excited. FIG. 10A actually illustrates the shear movement of a third harmonic. In this mode, four neutral vibration points or lines are observed in each electrode. The electrode shear mode as shown FIG. 10A is obtained for a transducer structure with a 700 nm thick Al vertical electrodes, metal ratio a/p is 0.5, pitch is 1=4 μm and the piezoelectric layer LiTaO$_3$ (YX1)/ 42°. Contrarily to FIG. 7B, here the 3rd harmonic yields significant vibration at the edge of the electrode thus generating a signature of the mode for which a coupling can be characterized. In FIG. 10B, comparison is achieved for LTO, Si, Sift and Sapphire substrate considering a pyramid shape of the electrode, like illustrated in FIG. 4A, yielding better Q than the other types of electrodes. The other parameters are the same as for FIG. 10A.

Figure 10C:
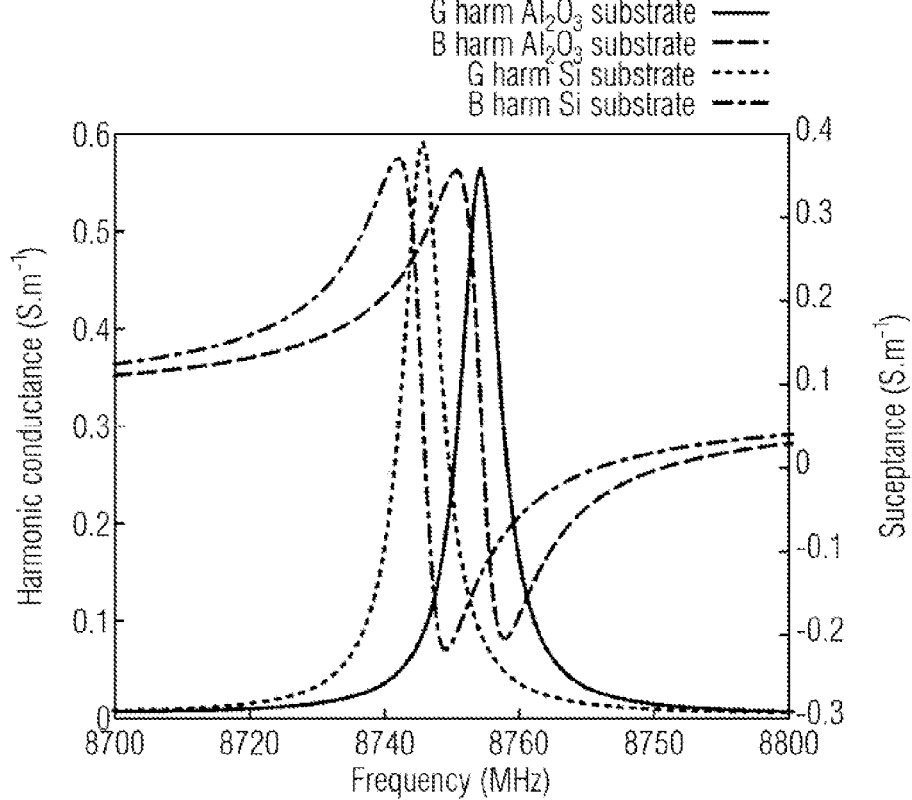
FIG. 10C illustrates the harmonic conductance and resistance of this mode for $Al_2O_3$ and Si substrates.

FIG. 10B and FIG. 10C illustrate the corresponding harmonic conductance G and susceptance B for various base substrates, LiTaO$_3$, SiO$_2$, Si and sapphire. These modes are of interest as due to the high resonant frequency around 8.75 GHz they show a high equivalent velocity. Using a transducer structure according to the present disclosure to excite the corresponding mode can advantageously be used in the development of high frequency, sources. FIG. 10C illustrating a sign change for the susceptance, indicates that coupling of the mode is effective.

Figure 11:
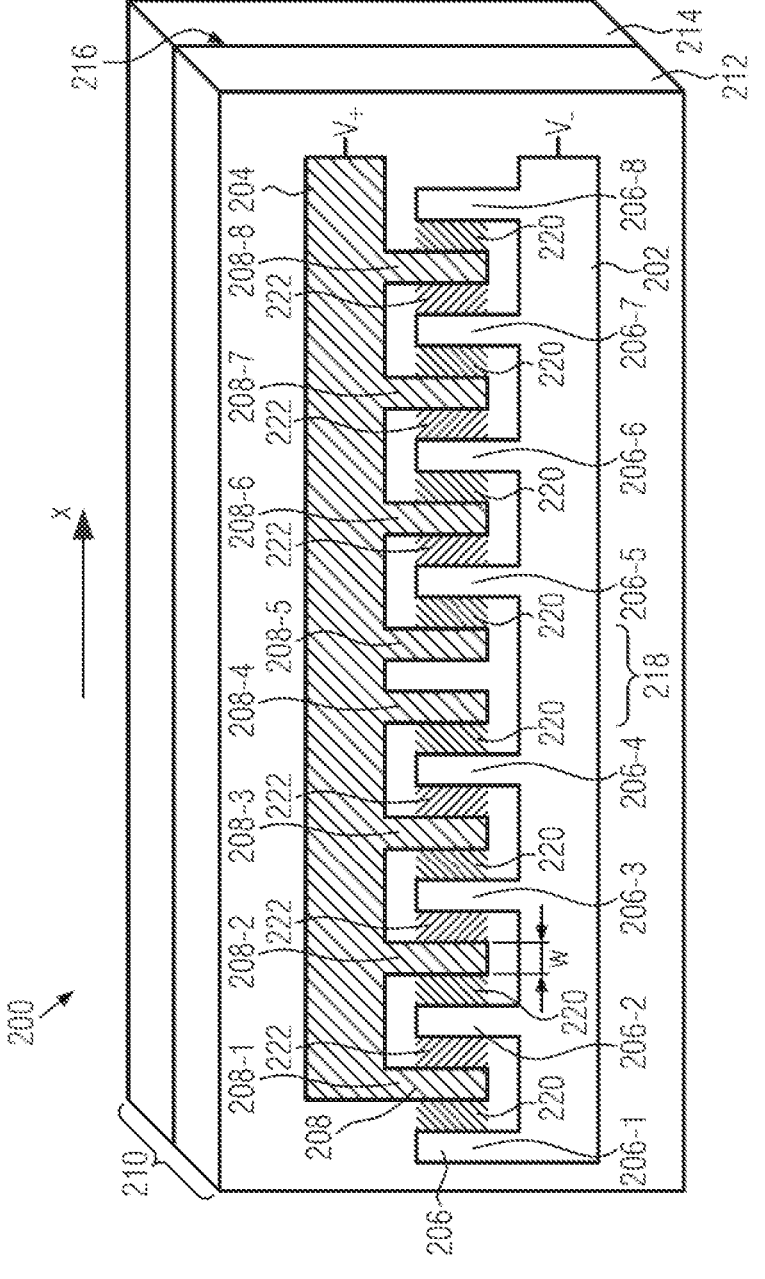
FIG. 11 illustrates an eighth embodiment of the present disclosure with suppressed acoustic sources.

FIG. 11 illustrates an eighth embodiment of the present disclosure. It illustrates an inter-digitated transducer structure 200 for a surface acoustic wave device according to a first embodiment of the present disclosure. The inter-digitated transducer structure 200 comprises a pair of inter-digitated comb electrodes 202 and 204 each comprising a plurality of electrode means 206 and 208 that are embedded into the piezoelectric layer 212.

Like in the first embodiment, the electrode means 206 and 208 have the shape of fingers 206, 208. In a variant of the embodiment, the electrode means could also have spilt fingers 206, 208 comprising each two or more directly adjacent electrode fingers belonging to the same comb electrode.

The piezoelectric layer 212 is part of a composite substrate 210 further comprising a base substrate 214. The piezoelectric layer is of the same material and has the same properties with respect to thickness as described in the other embodiments.

The thickness of the base substrate 214 can be larger than the thickness of the piezoelectric layer 212 to impose its thermal expansion to the piezoelectric layer 212 and to reduce the transducer's sensitivity to temperature changes. A preferred situation corresponds to a base substrate thickness that is at least ten times larger than the thickness of the piezoelectric layer 212.

The base substrate 214 is of the same material as in the first embodiments.

By using a different material for the base substrate 214, the flexibility in the design can be enhanced.

The pair of inter-digitated comb electrodes 202 and 204 comprises a plurality of electrode fingers 206 and 208. The electrode fingers, for example, 206_1, 208_1 to 206_4, 208_4, respectively, and 208_5, 206_7 to 208_8, 206_10 are inter-digitated and are connected to alternating potentials via their comb electrodes 202 and 204 and embedded in the piezoelectric layer 212. The alternating potential can be +V and −V as illustrated or in a variant a mass and a load/source potential. The electrode fingers are metallic and all have the same length l, width w, and thickness t. Furthermore, also here an electrode pitch p, defined as $\lambda/2$, is used for the transducer structure 200. The number of electrode fingers is not fixed and the device can comprise more or less than illustrated in FIG. 11.

According to a variant of the present disclosure, the electrode fingers 206, 208 can also have different length l, width w and thickness $t_e$.

As in the first embodiments, the thickness $t_e$ is equal or less than the thickness of the piezoelectric layer 212.

The eighth embodiment has the particularity in that the transducer structure 200 further comprises a region 218, also called second region, where two neighboring electrode fingers 208_4 and 208_5, also meaning directly neighboring electrode fingers, are connected to the same potential, here +V, without any electrode fingers 206 from the opposing inter-digitated comb electrode 202 in between. The two neighboring electrode fingers 208_4 and 208_5 can also be connected to —V, or to mass, or to a load/source potential VIN (not shown). In this context first region or first regions are parts of the transducer structure in which directly neighboring electrode fingers belong to different comb electrodes.

In the variant where the electrode means 206, 208 are represented by split fingers 206, 208 of two or more adjacent fingers at the same potential, two neighboring electrode means 206, 208 connected to the same potential can refer to all fingers of the split fingers 206, which are connected to the same potential of the split fingers 208. But it could also be that at least one electrode finger of the split fingers 206 is connected to the same potential of the split fingers 208.

In FIG. 11, the region or second region 218 is actually placed in the middle of the transducer structure 200, so that on each side, left and right, of the region 218, eight electrode fingers or four electrode finger pairs are present. In a variant of the embodiment, the region 218 can be placed at a different position in the transducer structure, so that the electrode finger pairs are distributed not evenly on either side of the region 218. The region 218 can also be placed on either extremity end of the transducer structure 200.

As mentioned previously, the electrode fingers 206_1, 208_1 to 206_4, 208_4, respectively, and 208_5, 206_5 to 208_8, 206_8 are inter-digitated and have alternating potentials. It can actually be seen, that due to the presence of the region 218, on the left side of the region 218, the inter-digitated electrode fingers 206_1, 208_1 to 206_4, 208_4 are at alternating potential −V/+V, respectively, while on the right side of the region 218, the inter-digitated electrode fingers 208_5, 206_5 to 208_8, 206_8 are at alternating potential +V/−V, respectively.

A pair of neighboring electrode fingers connected at alternating potential defines an electro-acoustic source. For example, here in FIG. 11, the neighboring inter-digitated electrode fingers 206_1 and 208_1 at alternating potential −V/+V define an electro-acoustic source 220. But the neighboring inter-digitated electrode fingers 208_1 and 206_2 at alternating potential +V/−V define also an electro-acoustic source 222. Thus, the pair of neighboring inter-digitated electrode fingers 206_2, 208_2 to 206_4, 208_4 each also defines an electro-acoustic source 220 and, respectively, the pair of neighboring inter-digitated electrode fingers 208_2, 206_3 and 208_3, 206_4 each also defines an electro-acoustic source 220. In particular, here, on the left of the region 218, four active electro-acoustic sources 220 and three active electro-acoustic sources 222, with in total eight inter-digitated electrode fingers 206_1, 208_1 to 206_4, 208_4 are present.

On the right side of the region 218, a pair of neighboring inter-digitated electrode fingers, for example, 208_5 and 206_5 connected at alternating potential +V/−V defines also an electro-acoustic source 222, and the pair of neighboring inter-digitated electrode fingers 206_5 and 208_6 at alternating potential −V/+V define an electro-acoustic source 220. On the right side of the region 218, four active electro-acoustic sources 222 and three active electro-acoustic sources 220, with in total eight inter-digitated electrode fingers 208_5, 206_5 to 208_8, 206_8 are present. But here, the electro-acoustic sources 220, 222 on the left side of the region 218 are in opposition of phase with the electro-acoustic sources 222, 220 on the right side of the region 218, in particular, of $\pi$.

However, as the electrode pitch p is defined as $\lambda/2$, this signifies that the transducer structure 200 is operating in a synchronous mode, at the Bragg condition. Therefore, the plurality of electro-acoustic sources 220, 222 on the left side of the region 218 are all in phase and coherent with each other, while the plurality of electro-acoustic sources 222, 220 on the right side of the region 218 are all in phase and coherent with each other.

In the region 218, there is no electro-acoustic source 220 or 222 between the two neighboring electrode fingers 208_4 and 208_5, as they are both connected to the same potential.

According to a variant, the polarity of the potential could be swapped between the first and second inter-digitated comb electrodes 206 and 208, or connected to mass on the one comb electrode and a load/source potential VIN on the other comb electrode.

Due to the presence of the second region 218 in the transducer structure 200, the phase of the electro-acoustic sources within the transducer has been inverted by 7C, as the electro-acoustic sources on the left side of the region 218 are in opposition of phase with the electro-acoustic sources on the right side of the region 218. Thus, destructive interference is created between the electro-acoustic sources in the transducer by combining the energy emitted from each side of the two electrode fingers connected to the same comb electrode toward the transducer, whereas the energy emitted toward the outside of the transducer will actually be launched and reflected by the mirror, positioned on either side of the transducer structure in a SAW device.

Therefore the amount of electro-acoustic sources present in the transducer structure 200 being coherent and in phase in the transducer structure 200 is reduced compared to a transducer structure of the same size, where all the electrode fingers are at alternating potentials, as e.g., shown in FIG. 1. As a consequence, the electromechanical coupling coefficient $k_s^2$ in the transducer structure has been reduced.

Here, in this particular embodiment, the left and right side of the region 218 in the transducer structure 200 have exactly the same number of inter-digitated electrode fingers 206 and 208, namely eight, resulting in seven active electro-acoustic sources, as the region 218 is located in the middle of the transducer structure 200. Here, the electromechanical coupling coefficient $k_s^2$ in the transducer structure 200 is reduced by a factor of 2. Again, as destructive interference is created between the electro-acoustic sources in the transducer structure, by combining the energy emitted from each side of the two electrode fingers connected to the same comb electrode toward the transducer, whereas the energy emitted toward the outside of the transducer will actually be launched and reflected by the mirror. The transducer efficiency is therefore reduced by a factor of two.

Furthermore, the possibility of phase coherence of the modes being reflected at the interface 216 of the composite substrate 212 is also modified compared to the prior art situation. If the phase is shifted within the transducer structure, there is no chance to detect waves, which do not match the phase matching condition. Therefore, there is a reduction in detection of the reflected acoustic waves from the interface 216, which will in turn lead to a reduction of the parasitic resonances at unwanted frequencies due to these reflections in the filter performance of a SAW device based on a transducer structure 200.

Therefore, the generation and/or detection of acoustic waves in the transducer structure 200 according to the present disclosure is controlled by the amount of electro-acoustic sources in phase present in the transducer structure 200. Having two neighboring electrode fingers connected to the same potential results in a phase change of π within the structure, which has a positive influence on the efficiency of the transducer structure to reject parasitic modes. It is not needed to vary the dimensions of the transducer, such as width or length or inter-electrode distance of the electrode fingers, which would have an impact on the fabrication technology of such structures and might significantly reduce the quality of the resonance of a resonator exploiting the above described transducer structures.

According to a variant of the eighth embodiment, more than just one region 218 could be present in the transducer structure, therefore increasing the number of suppressed electro-acoustic sources in the transducer structure and thereby decreasing the electromechanical coupling coefficient $k_s^2$ further. This is an efficient way to control the bandwidth of the filter, thus giving more degree of freedom to address various filter bands.

According to another variant, more than just two neighboring electrode means 208_4 and 208_5, i.e., three or more, could be linked to the same potential, thereby suppressing further sources. In addition, or according to another variant, more than one region with suppressed sources could be present. In that case, it would be advantageous to distribute them in a random manner over the extension of the transducer structure. In case there are more regions, the number of neighboring electrode means linked to the same potential is different.

Figures 12A, 12B, 12C:
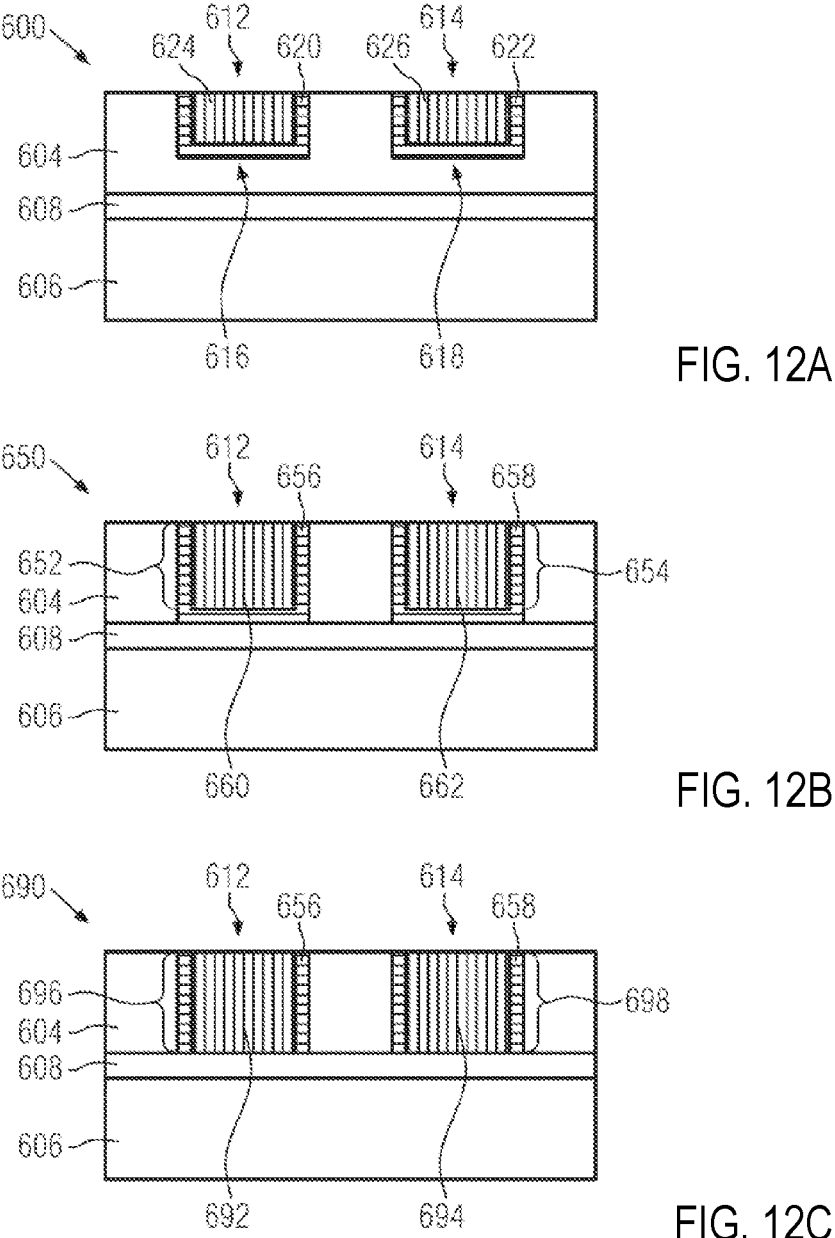
FIGS. 12A to 12C illustrate three variants of a ninth embodiment of the present disclosure.

FIGS. 12A to 12C illustrate three variants of a ninth embodiment of the present disclosure. Unlike the above described cases, as illustrated, for example, in FIG. 1 or 4A to 4C, in which the grooves within the piezoelectric layer are filled exclusively with a conducting material, in particular, a metal like Al or an Al alloy, the variants of the transducer structure of the ninth embodiment also comprise a dielectric material within the grooves of the piezoelectric layer. Besides this difference, the variants of the sixth embodiments have the same structural features and properties as the first embodiment and can be combined with any one or a combination of the other embodiments two to eight.

FIG. 12A illustrates a partial cut view of a transducer structure 600 of a first variant of the ninth embodiment with two neighboring electrode means 612 and 614 each belonging to a different comb electrodes. The electrode means 612 and 614 are embedded in grooves 616 and 618 in a piezoelectric layer 604 provided on base substrate 606 via an attachment layer 608. The side and bottom walls of the grooves 616 and 618 in this embodiment are covered by a conductive material 620 and 622, e.g., Al or an Al alloy like described above. The remainder of the grooves 616 and 618 is at least partially filled up with a dielectric material 624 and 626, in particular, diamond carbon.

FIG. 12B illustrates a transducer structure 650 according to a variant of the ninth embodiment. Elements with the same reference numeral as used for the first variant of transducer structure 600 will not be described again, but reference is made.

In this variant, the grooves 652 and 654 extend through the entire piezoelectric layer until the attachment layer 608. Again, the sidewalls of the grooves 652 and 654 and the bottom of the groove, now in contact with the base substrate 606 of the attachment layer 608 are covered by the conductive material 656 and 658. The remainder of the grooves 652 and 654 is at least partially filled up with the dielectric material 660 and 662. The same materials as in the first variant can be used.

The interest of this embodiment is to allow for using a material with a phase velocity larger than the one of the metallic material, in particular, the Al-based metals. The consequence is that higher frequencies can be reached by this embodiment compared to the first embodiment.

FIG. 12C illustrates a third variant of a transducer structure 690. The only difference with respect to the second variant is that the dielectric material 692 and 694 extends through the entire thickness of the grooves 696 and 698 to reach the attachment layer 608, so that only the sidewalls of the grooves 696 and 698 are covered by the conductive material 656 and 658.

FIGS. 13A to 13D illustrate the method to obtain the first variant according to the ninth embodiment.

Figures 13A, 13B, 13C, 13D:
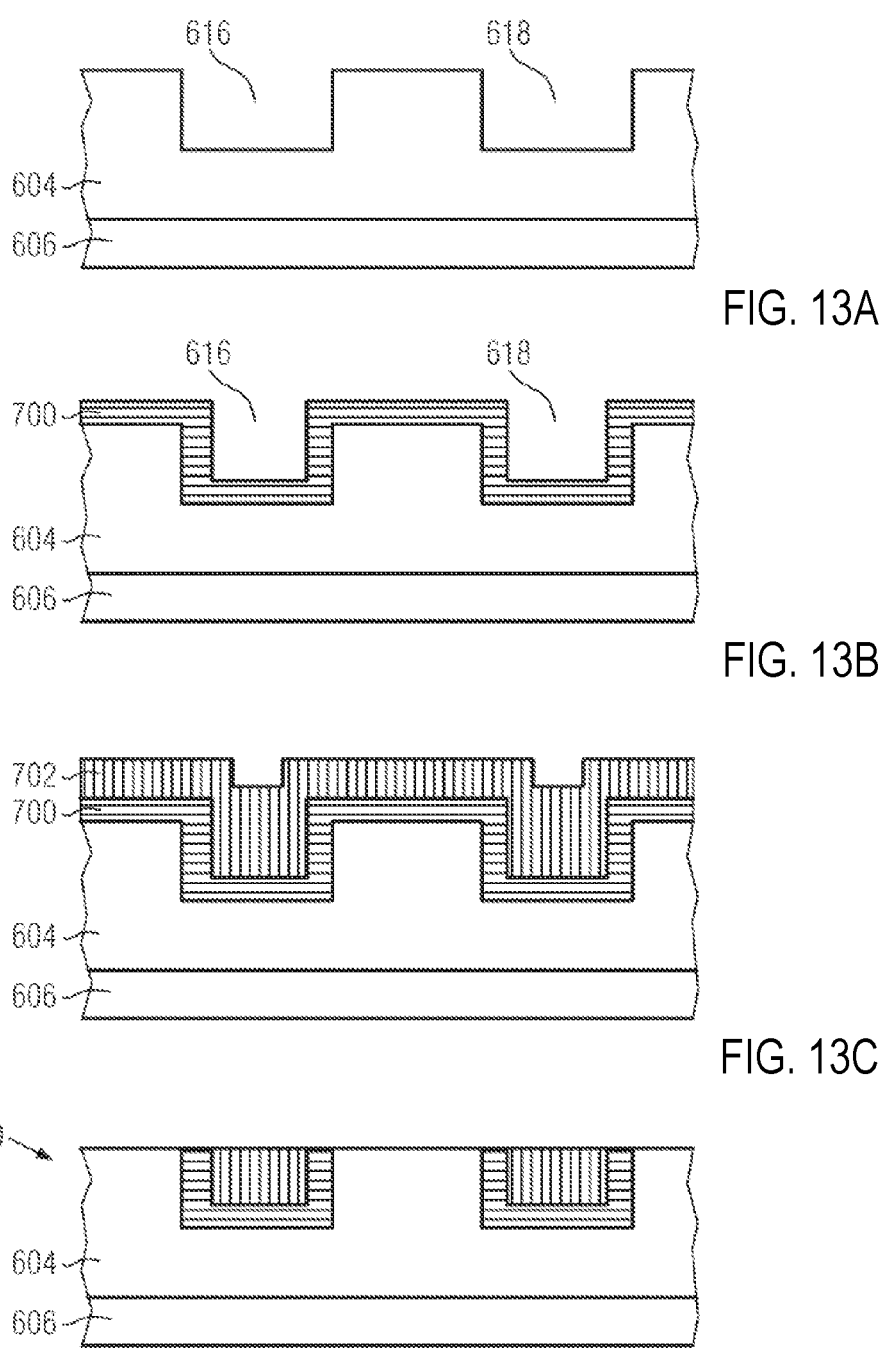
FIGS. 13A to 13D illustrate the process to obtain the shape of the electrodes as illustrated in FIG. 12A.

The grooves 616, 618 are etched into the piezoelectric layer 604 as illustrated in FIG. 13A. Then a metal deposition step is carried out as illustrated in FIG. 13B to cover the piezoelectric layer 604 and the walls of the grooves 616, 618 with a metallic layer 700. Subsequently, a dielectric layer 702 is deposited onto the metallic layer 700 such that the grooves 616 and 618 are at least partially filled up with the dielectric material. This is illustrated in FIG. 13C. Finally, a polishing step is realized, e.g., a CMP polishing step to obtain the transducer structure 600.

The second variant of the transducer structure 650 can be obtained by adapting the etching step such that the grooves reach through the piezoelectric layer 604 until the base substrate 606.

Figures 14A, 14B:
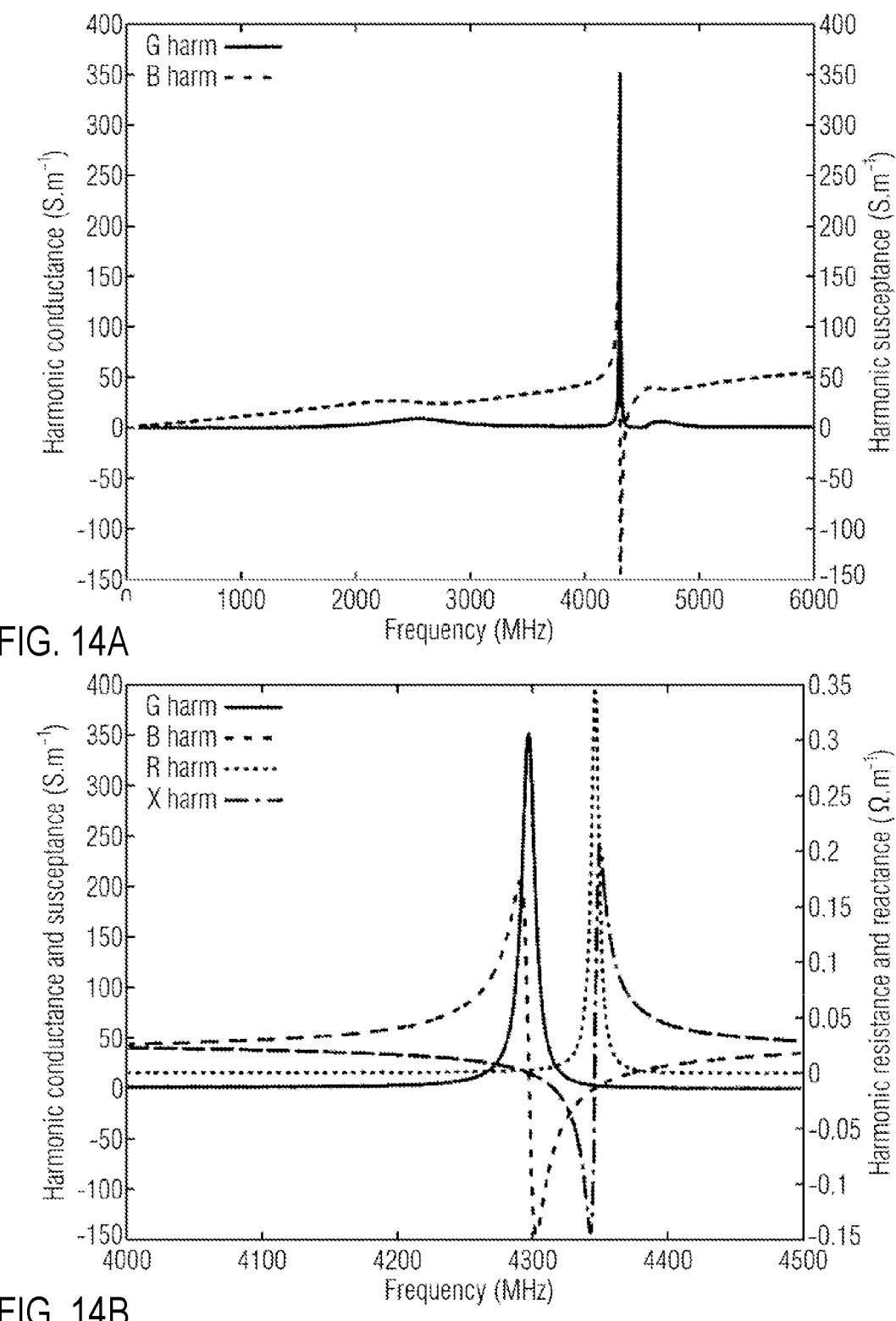
FIGS. 14A and 14B illustrate the admittance and impedance of the transducer structure according to the ninth embodiment when using diamond like carbon as dielectric.

FIG. 14A illustrates numerical simulation results of the conductance G and susceptance B and FIG. 14B the conductance G and susceptance B as well as resistance R and reactance X of the structure as shown in FIG. 12B. In the simulation, Diamond-Carbon was used as dielectric material and aluminum as the metal within the groove. The piezoelectric layer 604 is LiTaO$_3$ (YX1)/42°. The base substrate 606 is also Lithium Tantalate (same crystal cut) bonded to the piezoelectric layer 604 by an attachment layer 608 of silica SiO$_2$.

This structure, also called homotype bounding, meaning that the same material is used as substrate and piezoelectric layer is bonded using SiO$_2$. SiO$_2$ can be used as etch-stop layer to control the piezoelectric layer thickness and therefore the excitation layer thickness. SiO$_2$ can furthermore help reducing the TCF. The part of the structure underneath the silica attachment layer is also called radiation domain, in which unwanted modes dissipate, whereas the desired mode remains in the guiding domain above the attachment layer 608.

The mechanical period or electrode pitch p is 1.4 μm and the embedded electrode thickness is 500 nm with a 100 nm thick metal layer 656, 658 and a 400 nm thick AlN/Carbon Diamond as dielectric fill-in material 660, 662. For the simulation, an aspect piezo/electrode ratio close to a/p=0.5 was used. The mode observed corresponds to a leaky wave, but the quality factors Q$_r$ at resonance and Q$_a$ at anti-resonance are found equal to 400 and 670, respectively, for a coupling factor of 2.2% with a phase velocity of 12 km.

Figure 14C:
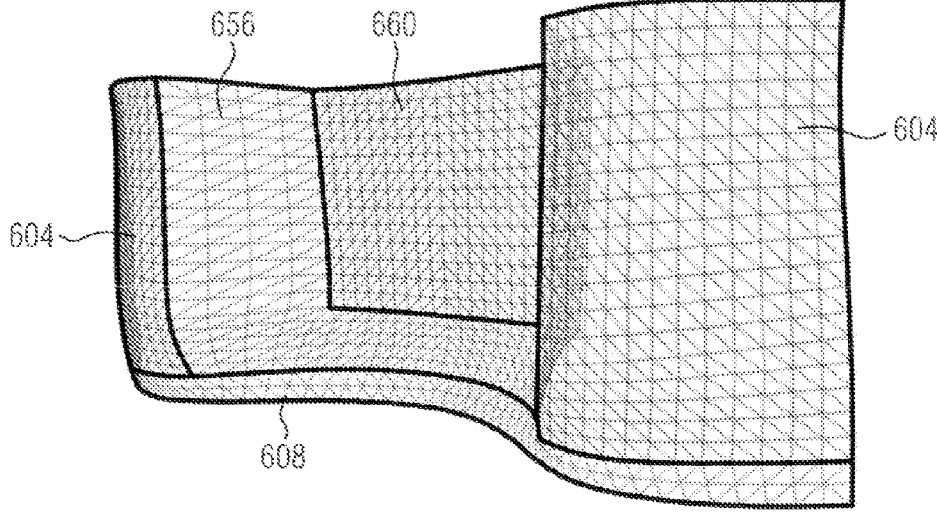
FIG. 14C illustrates a mesh view illustrating the vibration of the mode observed in the transducer structure according to the ninth embodiment.
Figures 15A, 15B:
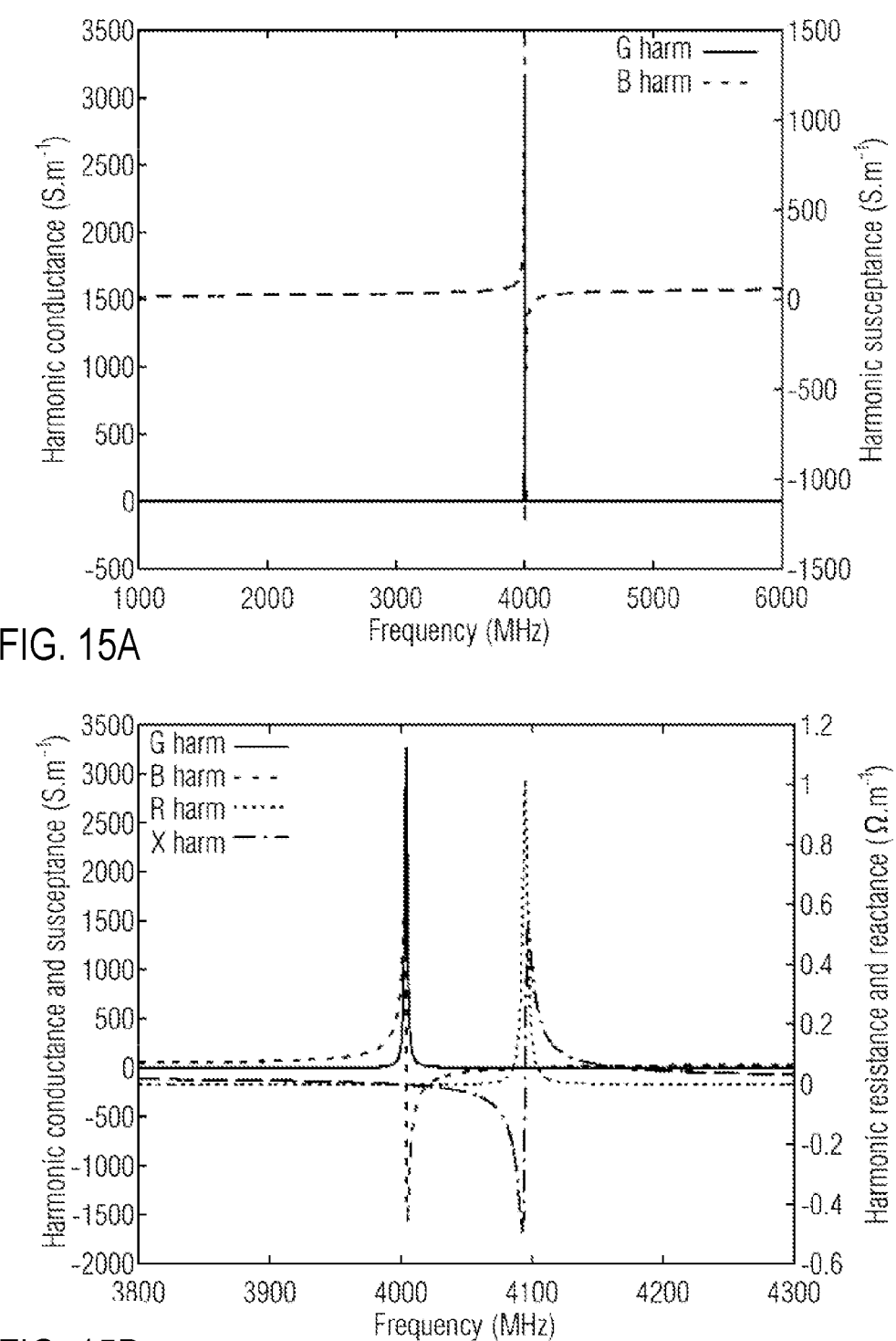
FIGS. 15A and 15B illustrate the admittance and impedance of the transducer structure according to the ninth embodiment when using aluminum nitride as dielectric.

FIG. 14C illustrates the electrode mode as obtained by numerical simulation, with a shear mode like vibration present in the electrode, namely the metallic part 656 and the dielectric part 660, whereas the piezoelectric layer 604 is less moving. FIG. 14C illustrates the finite element mesh of the piezoelectric layer 604, the embedded electrode as well as the attachment layer 608. In the simulation, the boundary conditions take into account the wave behavior in the radiation domain beneath the attachment layer 608. FIG. 15A illustrates the numerical simulation results of the harmonic conductance G and susceptance B and FIG. 15B the harmonic conductance G and susceptance B as well as harmonic resistance R and reactance X with aluminum nitride AlN as the dielectric 660, 662 in the structure as shown in FIG. 12B. Besides the dielectric material, all other structural parameters were the same. AlN has a phase velocity reduced to 11.3 km·s-1 compared to diamond like carbon. In this variant, a coupling factor of 4.4% and quality factors Q$_r$=1850 and Q$_a$=990 can be observed.

Figure 16A:
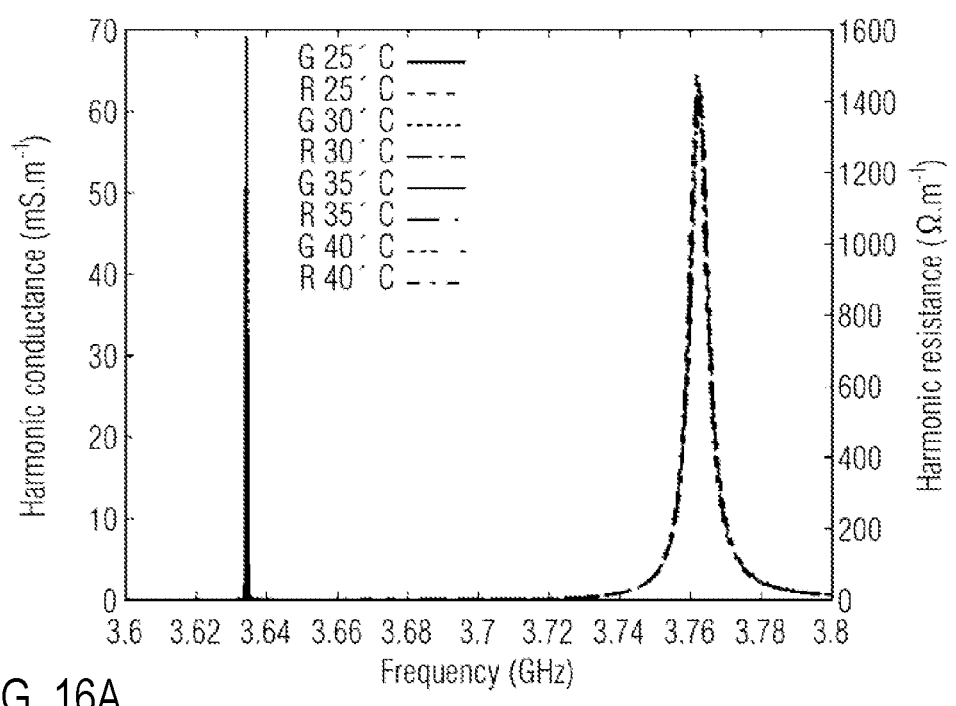
FIG. 16A illustrates the conductance G and resistance R, FIG. 16B a zoom on the resonance and FIG. 16C a zoom on the anti-resonance of the transducer structure according to the ninth embodiment when using silicon dioxide as dielectric.
Figure 16B:
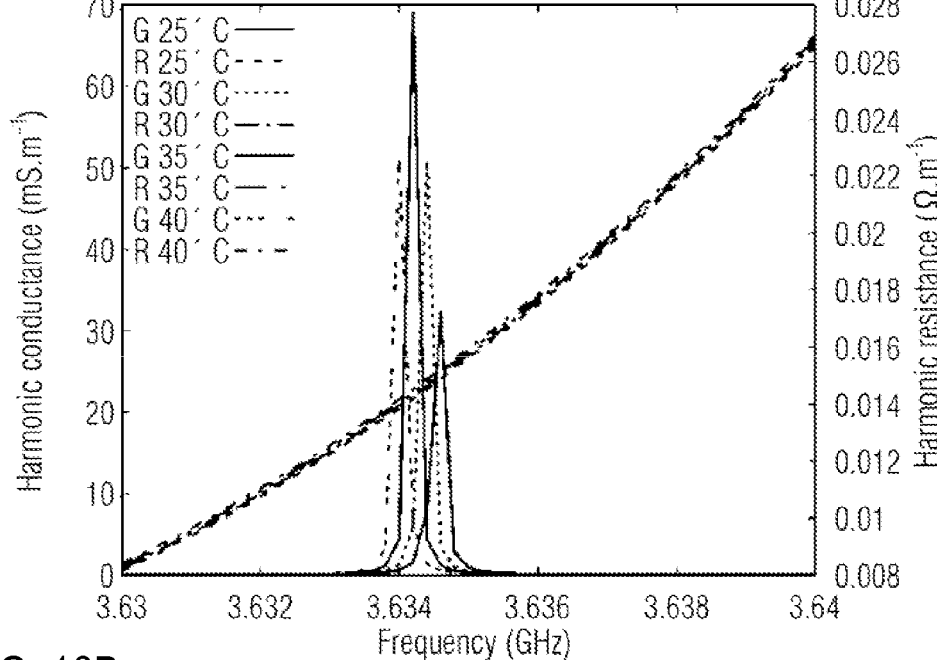
FIG. 16D illustrates a fourth variant of the transducer according to the ninth embodiment.
Figure 16C:
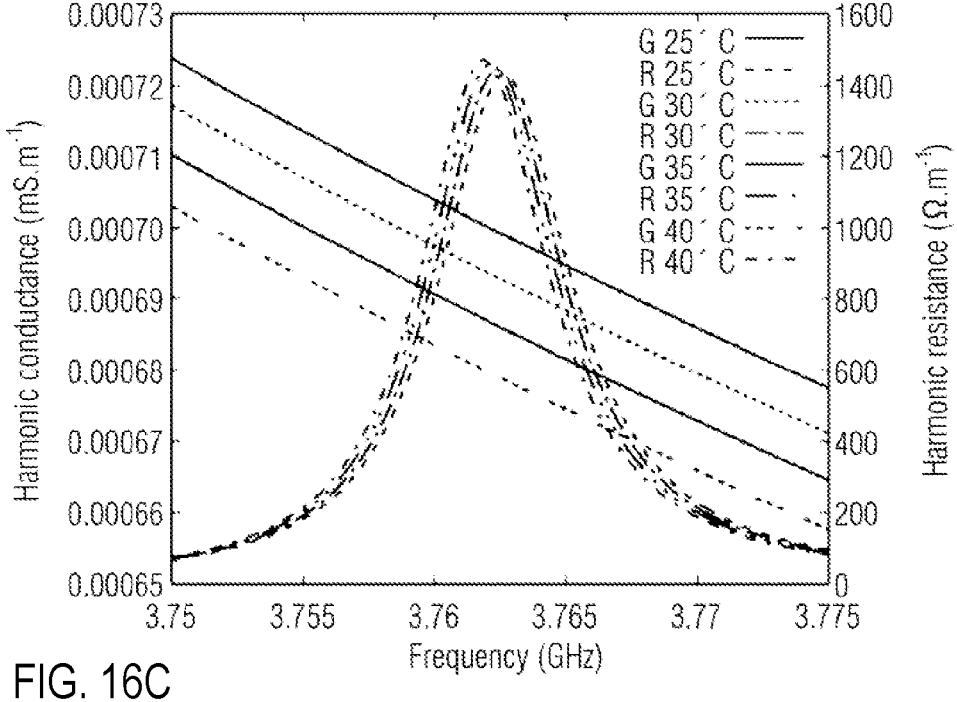

FIG. 16A illustrates the numerical simulation results of the harmonic conductance G and resistance R, FIG. 16B a zoom on the resonance and FIG. 16C a zoom on the anti-resonance. In this variant, the dielectric 660, 662 is silicon dioxide Sift in the structure as shown in FIG. 12B. Besides the dielectric material, all other structural parameters were the same as in the first and second variant of the ninth embodiment.

The use of SiO$_2$ improves the TCF compared to transducer structures with grooves exclusively filled with metallic material of the observed mode. This is due to the fact that the TCF coefficient of Sift being equal to +80 ppm·K$^{-1}$ is opposite to the one of metals.

Indeed, here a TCF value of the resonance of −11 ppm·K$^{-1}$ and of −14.7 ppm·K$^{-1}$ for the anti-resonance is observed when using SiO$_2$ as dielectric 660, 662. The coupling; factor is 6.7% and the quality factor of the resonance Q$_R$ is larger than 5000. Q$_{Ar}$ is less, about 650, but can be improved by optimizing the structural parameters of the design.

Figure 16D:
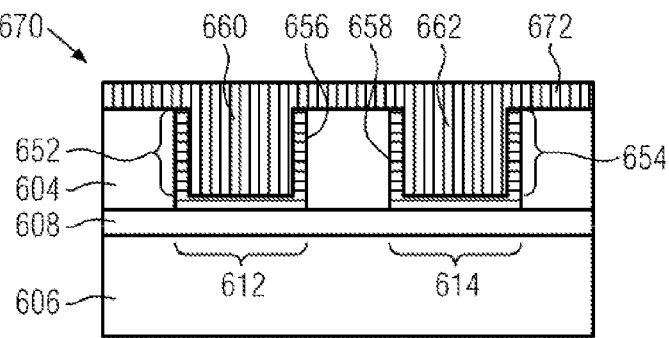

The observed TCF numbers can be even further improved when providing an additional layer of SiO$_2$ above the transducer structure 650 as illustrated in FIG. 16D. It illustrates the transducer structure 670 according to a fourth variant of the ninth embodiment. The transducer structure 670 corresponds to the transducer structure 650 of FIG. 12B, except for the presence of the additional layer 672 of SiO$_2$. The dielectric material could also extend down through to the attachment layer 608 like illustrated in FIG. 12C.

Another aspect of providing such layer is the acceleration of the phase velocity of the mode, as already described above in relation to FIG. 7, to accelerate the fundamental shear mode above the SSBW velocity of the substrate 606, if needed to dissipate the fundamental mode observed.

Instead of using the same dielectric material to fill the grooves and to provide the additional layer 672, two different materials can be used to further optimize TCF as well as phase velocity.

Figure 17A:
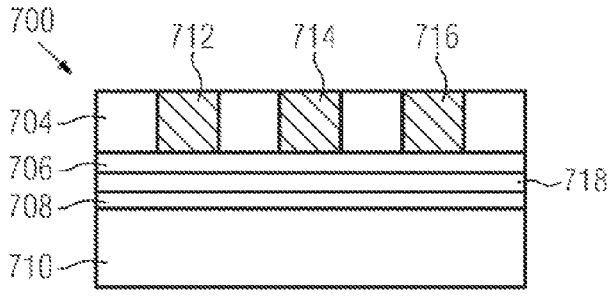
FIGS. 17A and 17B illustrate two variants of a transducer structure according to a tenth embodiment.
Figure 17B:
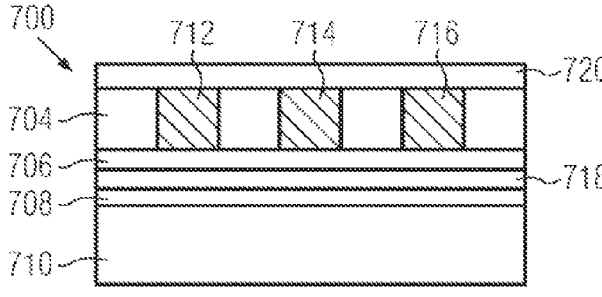

FIGS. 17A and 17B illustrate two variants of a tenth embodiment of the present disclosure. Situations can occur in which the electrode mode can be observed at the same time as standard guided shear modes, e.g., the fundamental guided shear mode, as illustrated, for instance, in FIG. 7D.

Such a situation can also occur when using a POI composite substrate with a LiTaO$_3$ piezoelectric layer on Sift, A typical example of such a POI substrate is 600 nm thick LiTaO$_3$ on 500 nm thick Sift on a 1 μm trap-rich poly Si layer on a base substrate of Si(100). In this configuration, the persistence of the fundamental guided shear mode is observed at a phase velocity between 3800 and 4200 m·s$^{-1}$ and thus yields potential problems when addressing high frequency bands using the electrode mode at frequency about twice and a half higher than the electrode mode.

As already mentioned, see description in relation to FIGS. 3A to 3F, the choice of the base substrate 106, 205, 306, 406, 506, 606 plays an important role. Indeed, in case the SSBW velocity of the substrate is smaller than the one of the fundamental acoustic bulk shear mode in the piezoelectric layer, the bulk shear mode will enter the base substrate and becomes dissipated therein.

The contribution of the fundamental guided shear mode can already be reduced by using a Si(111) base substrate, which presents the advantage of having a SSBW velocity smaller than the one on Si(100), typically 4700 m·s$^{-1}$ or even less, instead of 5650 m·s$^{-1}$. Si orientation corresponding to (YXw)/45° is particularly interesting in that purpose. However, in that case, a signature of the fundamental shear guided mode can still be observed, even though, a couple of higher order modes were suppressed, as already described.

To even further reduce the remaining contribution of the fundamental guided shear mode, the transducer structure according to the tenth embodiment comprises at least one additional layer within the stack. The additional layer is chosen to accelerate the fundamental guided shear wave to push its velocity further above the SSBW velocity of the substrate.

The transducer structure 700 as illustrated in FIG. 17A comprises a LiTaO$_3$ piezoelectric layer 704 with embedded electrodes 712, 714, 716, here made of aluminum, on a SiO$_2$ layer 706. The structure further comprises a trap-rich poly Si layer 708 on a base substrate 710 of Si(111).

The transducer structure 700 further comprises an additional layer 718, also called high velocity low loss layer, sandwiched between the SiO$_2$ layer 706 and the trap rich layer 708. The high velocity layer 718 is one of an AlN, Al$_2$O$_3$, Si$_3$N$_4$ or SiC layer. All these materials exhibiting compressive bulk wave velocity values of more than 10 km·s$^{-1}$ and shear bulk wave velocity of more than 5 km·s$^{-1}$. As an alternative, the high velocity layer 718 can be based on Carbon: single-crystal Diamond, amorphous carbide layer, nano-grain polycrystal diamond (NCD) and all diamond-like carbon layers that could push the compressional wave velocity above 15 km·s$^{-1}$ and shear wave velocity above 7 km·s$^{-1}$.

Figures 18A, 18B, 18C:
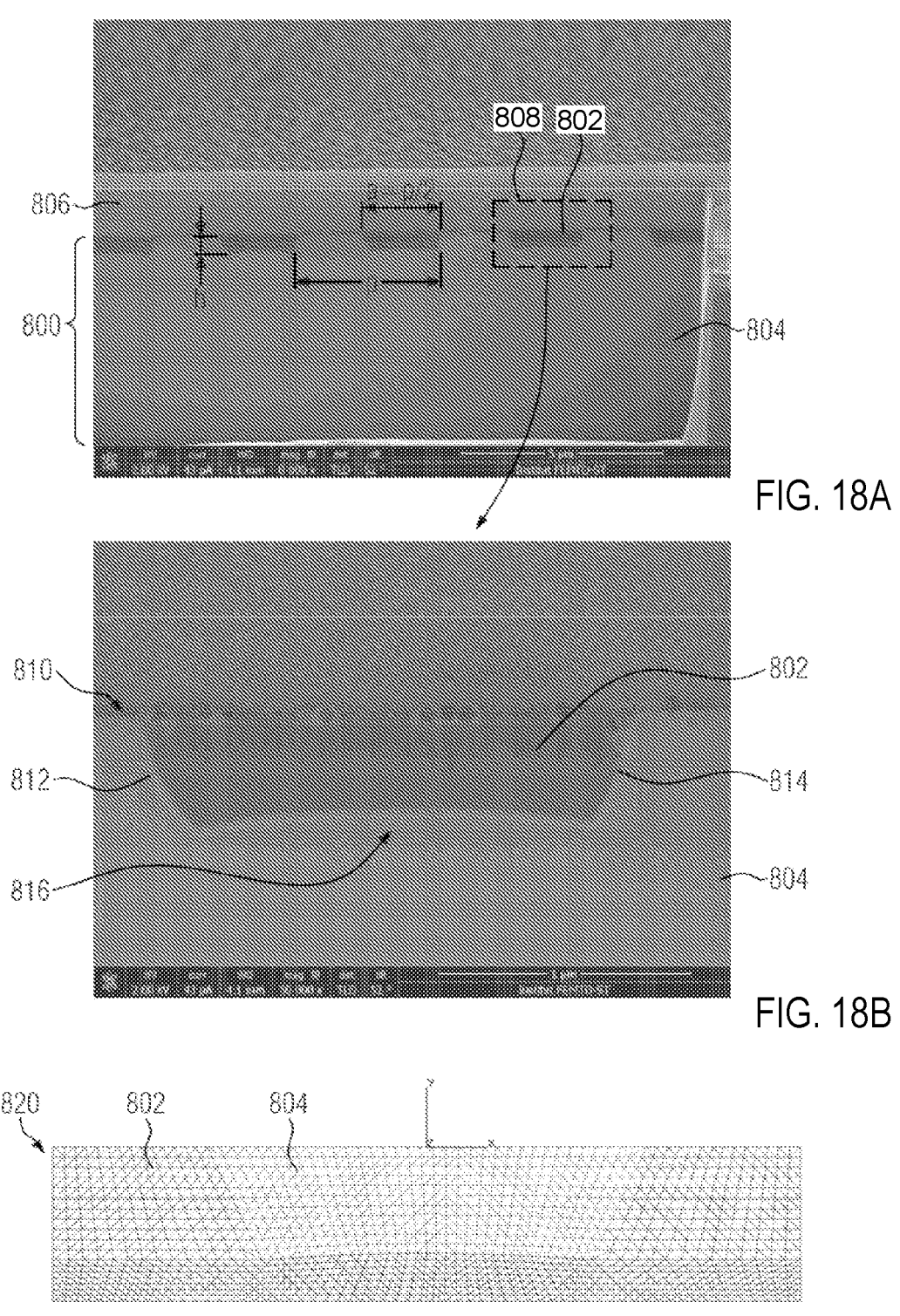
FIGS. 18A and 18B show two images taken by an electron microscope showing a practical example of the transducer according to the present disclosure.
FIG. 18C illustrates the finite element mesh used to simulate the behavior of the practical example shown in FIGS. 18A and 18B.

FIG. 17B illustrates a second variant of the tenth embodiment. It is based on the first variant, but comprises, in addition, a second additional layer 720, also a high velocity low loss layer, which can be of the same or a different material than the first additional layer 718. Both layers 718, 720 will accelerate the velocity of the fundamental guided shear mode. FIG. 18A shows an image taken by an electron microscope showing a practical example of the transducer, according to the present disclosure. The picture shows a side cut view of a transducer structure 800, corresponding to the structure of the first embodiment as illustrated in FIG. 1 the transducer structure 800 has aluminum electrodes 802 embedded into a LiTaO$_3$ (YX1)/42° bulk substrate 804. The layer 806 above the electrodes 802 and the surface of the bulk substrate 804 has been added after measuring the properties of the transducer and serves as a contrast-enhancing layer for imaging purposes. The pitch was p=3.4 μm and the height of the electrode 802 h=510 nm. The aspect ratio a/p was 0.5. The structure had 50 pairs of electrode means.

FIG. 18B is an enlarged view of the region highlighted by rectangle 808 in FIG. 18A thus illustrating the shape of the electrode 802. The groove in the bulk substrate 804 has a trapezoidal shape with the longer of the parallel sides being aligned with the surface 810 of the bulk substrate 804. The sidewalls 812 and 814 are slightly concave shaped, the bottom surface 816 being convex.

FIG. 18C illustrates the finite element mesh 820 simulating the electrode 802 shape of the practical example embedded in the piezoelectric substrate 804 used to simulate the behavior of the practical example shown in FIGS. 18A and 18B.

Figures 19A, 19B:
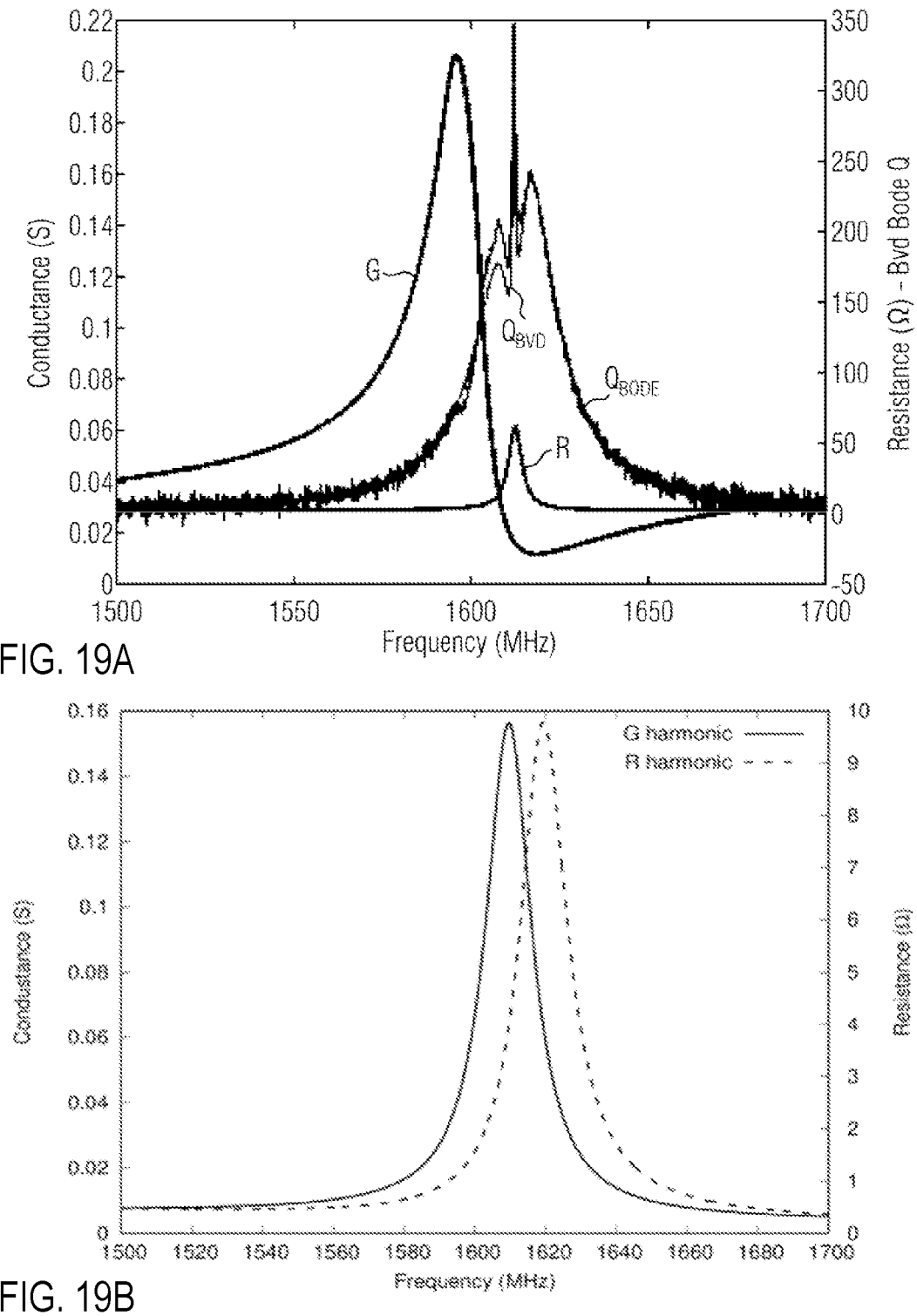
FIG. 19A illustrates the experimental measurements of susceptance and resistance of the practical example.
FIG. 19B illustrates the results of susceptance and resistance obtained by numerical simulation of the structure as shown in FIG. 18C.

FIG. 19A illustrates the experimental measurements of conductance and resistance of the practical example. FIG. 19B illustrates the results of conductance and resistance obtained by numerical simulation of the structure as shown in FIG. 18C.

The fabricated device as shown in FIGS. 18A and 18B showed a phase velocity of the mode of 10950 m·s$^{-1}$ a coupling factor K$_s^2$ of 1.85% and a quality factor Q$_{ar}$=350. The mode was observed at a frequency of about 1.6 GHz thus much higher than the 580 MHz of the fundamental shear mode. The conductance and resistance as measured are illustrated in FIG. 19A.

The simulation results using a FEM mesh as illustrated in FIG. 18C and considering an infinitively long transducer structure provided results in conformity with the experimental results for the above described electrode mode. A velocity of 10862 m·s$^{-1}$, a coupling factor K$_s^2$ of 0.62% and a quality factor Q$_{ar}$ of the order of 100 can be observed. In addition, the mode occurs at about 1.6 GHz and shows similar behavior in the conductance and resistance dependency.

A number of embodiments of the present disclosure have been described. Nevertheless, it is understood that various modifications and enhancements may be made without departing from the following claims.

The invention claimed is:

1. A transducer structure for an acoustic device, comprising:
   a base substrate;
   a piezoelectric layer disposed over the base substrate;
   a trap rich layer between the piezoelectric layer and the base substrate;

a pair of inter-digitated comb electrodes, comprising a plurality of electrode means with a pitch p;
   wherein the electrode means of the inter-digitated comb electrodes are embedded in the piezoelectric layer, and the acoustic impedance of the electrode means is less than the acoustic impedance of the piezoelectric layer.

2. The transducer structure according to claim 1, wherein the pitch p satisfies the Bragg condition given by p=λ/2, λ being the operating acoustic wavelength of the transducer.

3. The transducer structure according to claim 1, wherein the aspect ratio a/p, with "a" the width and "p" the pitch of the electrode means, is between 0.3 and 0.75.

4. The transducer structure according to claim 1, further comprising an attachment layer between the piezoelectric layer and the base substrate.

5. The transducer structure according to claim 4, further comprising a high velocity layer between the piezoelectric layer and the base substrate, wherein the high velocity layer is made of a material allowing a higher phase velocity of a shear wave than the material and crystal orientation of the piezoelectric layer.

6. The transducer structure according to claim 5, wherein the high velocity layer is positioned between the attachment layer and the base substrate.

7. The transducer structure according to claim 6, wherein the trap-rich layer is positioned between the high velocity layer and the base substrate.

8. The transducer structure according to claim 1, further comprising a covering layer on top of the embedded electrode means and the piezoelectric layer.

9. The transducer structure according to claim 8, wherein the covering layer is made of a material and/or having a crystal orientation allowing a higher phase velocity of a shear wave than the material and/or crystal orientation of the piezoelectric layer.

10. The transducer structure according to claim 1, further comprising a Bragg mirror underneath the piezoelectric layer and/or the electrode means.

11. The transducer structure according to claim 1, wherein the thickness of the embedded electrode means is less than or equal to the thickness of the piezoelectric layer.

12. The transducer structure according to claim 11, wherein the thickness t$_e$ of the electrode means satisfies λ>t$_e$>0.1*λ.

13. The transducer structure according to claim 1, wherein the acoustic impedance of the base substrate is of the order of the acoustic impedance of the piezoelectric layer.

14. The transducer structure according to claim 1, wherein the embedded electrodes means are filled into grooves in the piezoelectric layer.

15. The transducer structure according to claim 14, wherein the grooves have a cross-section with a pyramidal shape or a trapezoidal shape or a V-shape or a U-shape, and/or wherein the sidewalls and/or the bottom of the grooves have a convex or concave or scalloped shape.

16. The transducer structure according to claim 14, wherein a dielectric layer is provided on the bottom of the grooves.

17. The transducer structure according to claim 16, wherein the dielectric material is a material with a higher shear wave phase velocity than the conductive material.

18. The transducer structure according to claim 16, wherein the dielectric material has a temperature coefficient frequency with a sign opposite to the temperature coefficient frequency of the conductive material.

19. The transducer structure according to claim 16, further comprising a covering layer on top of the embedded electrode means and the piezoelectric layer, and wherein a dielectric material of the covering layer and the dielectric material filled in the grooves is the same.

20. The transducer structure according to claim 1, wherein the electrode means is made of a material that is lighter than manganese.

21. The transducer structure according to claim 1, wherein the piezoelectric layer is Lithium Tantalate or Lithium Niobate.

22. The transducer structure according to claim 1, wherein the base substrate is one of silica, quartz, fused quartz or glass or $LiTaO_3$ or $LiNbO_3$ or silicon.

23. The transducer structure according to claim 5, wherein the high velocity layer is one of AlN, $Al_2O_3$, $Si_3N_4$, SiC or carbon based.

24. The transducer structure according to claim 8, wherein the covering layer is one of AlN, $Al_2O_3$, $Si_3N_4$, SiC or carbon based.

25. The transducer structure according to claim 16, wherein the dielectric material is carbon based, or AlN or $SiO_2$.

26. The transducer structure according to claim 1, wherein the pair of inter-digitated comb electrodes comprises one region or more regions in which two or more neighboring electrode means belong to the same comb electrode while having the same distance to each other as the neighboring electrode means belonging to different comb electrodes.

27. The transducer structure according to claim 26, wherein the two or more neighboring electrode means belonging to the same comb electrode have the same geometry as the neighboring electrode means belonging to different comb electrodes.

28. The transducer structure according to claim 1, wherein the electrode means have dimensions that are realizable by I-line lithography.

29. An acoustic wave device comprising at least one transducer structure according to claim 1, wherein the device is an acoustic wave resonator, and/or an acoustic wave filter, and/or an acoustic wave sensor, and/or a frequency source.

30. The acoustic wave device according to claim 29, further comprising a radio frequency (RF) supply means configured to drive the transducer structure with an RF signal above 3 GHZ.

31. A method of using a transducer structure according to claim 1, comprising a step of applying an alternating potential to the two inter-digitated comb electrodes to excite a shear mode that has a larger vibration amplitude in the electrode means compared to the piezoelectric layer and having an equivalent velocity higher than the fundamental shear wave mode of the piezoelectric layer.

32. The method according to claim 31, wherein the shear mode is predominantly occurring within the electrode means compared to the piezoelectric layer.

33. A method of using a transducer structure according to claim 1, comprising a step of applying an alternating potential to the two inter-digitated comb electrodes to excite a shear mode in the electrode means with a pair number of neutral lines without exhibiting shear movement inside the electrode and having an equivalent velocity higher than the fundamental shear wave mode of the piezoelectric layer.

34. The method according to claim 31, wherein the transducer structure is part of a filter, or a resonator, or a delay line, or a sensor.

35. The method according to claim 26, wherein the filter is used at a frequency higher than 3 GHz.

36. A transducer structure for an acoustic device, comprising:
   a piezoelectric layer;
   a pair of inter-digitated comb electrodes, comprising a plurality of electrode means with a pitch p;
   wherein the electrode means of the inter-digitated comb electrodes are embedded in the piezoelectric layer, and the acoustic impedance of the electrode means is less than the acoustic impedance of the piezoelectric layer;
   wherein the embedded electrodes means are filled into grooves in the piezoelectric layer; and wherein the sidewalls and bottom walls of the grooves are covered with a conductive material and the remainder of the grooves are filled with a dielectric material.

37. A transducer structure for an acoustic device, comprising:
   a piezoelectric layer;
   a pair of inter-digitated comb electrodes, comprising a plurality of electrode means with a pitch p;
   wherein the electrode means of the inter-digitated comb electrodes are embedded in the piezoelectric layer, and the acoustic impedance of the electrode means is less than the acoustic impedance of the piezoelectric layer;
   wherein the embedded electrodes means are filled into grooves in the piezoelectric layer;
   wherein the grooves extend through the piezoelectric layer and the sidewalls of the grooves are covered by a conductive material and the remainder of the grooves is filled with a dielectric material.

38. The transducer structure according to claim 37, wherein only the sidewalls toward the piezoelectric layer are covered by the conductive material.

* * * * *